United States Patent
Voznyuk et al.

(10) Patent No.: US 9,666,794 B2
(45) Date of Patent: May 30, 2017

(54) MULTI-STAGE ELEMENT REMOVAL USING ABSORPTION LAYERS

(71) Applicant: Samsung Electronics Co., Ltd., Suwon-si, Gyeonggi-do (KR)

(72) Inventors: Volodymyr Voznyuk, Fremont, CA (US); Dustin Erickson, Morgan Hill, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/081,831

(22) Filed: Mar. 25, 2016

(65) Prior Publication Data

US 2016/0211444 A1 Jul. 21, 2016

Related U.S. Application Data

(63) Continuation of application No. 14/712,792, filed on May 14, 2015.

(60) Provisional application No. 62/020,932, filed on Jul. 3, 2014, provisional application No. 62/256,102, filed on Nov. 16, 2015.

(51) Int. Cl.
*H01L 43/12* (2006.01)
*H01L 43/08* (2006.01)

(52) U.S. Cl.
CPC .............. *H01L 43/12* (2013.01); *H01L 43/08* (2013.01)

(58) Field of Classification Search
CPC ........ H01L 43/12; H01L 43/08; H01L 27/224
See application file for complete search history.

(56) References Cited

U.S. PATENT DOCUMENTS

| | | | | |
|---|---|---|---|---|
| 6,242,770 B1* | 6/2001 | Bronner | ................ | H01L 27/224 257/295 |
| 7,919,407 B1* | 4/2011 | Zhong | ............... | H01L 21/76807 257/E21.665 |
| 8,169,821 B1* | 5/2012 | Ranjan | .................. | G11C 11/161 365/148 |
| 9,362,489 B1* | 6/2016 | Guo | ........................ | H01L 43/12 |
| 2003/0104680 A1* | 6/2003 | Stefanescu | .......... | H01L 21/3221 438/471 |
| 2006/0098354 A1* | 5/2006 | Parkin | .................... | B82Y 10/00 360/324.2 |
| 2009/0027811 A1* | 1/2009 | Guo | ........................ | G11C 11/16 360/324.2 |
| 2009/0161267 A1* | 6/2009 | Kawai | .................... | B82Y 10/00 360/324.2 |

(Continued)

Primary Examiner — Jaehwan Oh
(74) Attorney, Agent, or Firm — Renaissance IP Law Group LLP

(57) ABSTRACT

An MTJ structure and method for providing the same are described. The method may include providing a free layer, a pinned layer, and a nonmagnetic spacer layer between the free layer and the pinned layer. Providing the free layer and/or the pinned layer may include depositing a portion of the desired MTJ layer, depositing a sacrificial layer, annealing the MTJ and sacrificial layer, removing at least a portion of the sacrificial layer, and depositing a remaining portion of the desired MTJ layer. The steps of depositing a sacrificial layer, annealing, and removing the sacrificial layer may be repeated multiple times with process conditions selected for each stage so as to reduce the risk of damage to the underlying MTJ layer. The desired MTJ layer may be the free layer, the pinned layer, or both.

18 Claims, 15 Drawing Sheets

(56) References Cited

U.S. PATENT DOCUMENTS

| | | | |
|---|---|---|---|
| 2010/0109106 A1* | 5/2010 | Zhong | H01L 43/12 257/421 |
| 2012/0280336 A1* | 11/2012 | Jan | H01L 43/08 257/421 |
| 2014/0154529 A1* | 6/2014 | Yang | G11B 5/3909 428/811.1 |
| 2014/0175581 A1* | 6/2014 | Guo | H01L 43/12 257/421 |
| 2014/0248719 A1* | 9/2014 | Zhou | G11C 11/161 438/3 |
| 2014/0252515 A1 | 9/2014 | Lai et al. | |
| 2014/0328116 A1* | 11/2014 | Guo | G11C 11/161 365/158 |

* cited by examiner

300

| 1st Ferromagnetic Layer (CoFeB) | 312 |
|---|---|
| Seed Layer(s) (MgO) | 302 |

| Sacrificial Insertion Layer (W) | 304 |
|---|---|
| 1st Ferromagnetic Layer (CoFeB) | 312 |
| Seed Layer(s) (MgO) | 302 |

| 1st Ferromagnetic Layer (CoFeB) | 312' |
|---|---|
| Seed Layer(s) (MgO) | 302 |

| 2nd Ferromagnetic Layer (CoFeB) | 314 |
|---|---|
| 1st Ferromagnetic Layer (CoFeB) | 312' |
| Seed Layer(s) (MgO) | 302 |

| Nonmagnetic Spacer Layer (MgO) | 320 |
|---|---|
| 2nd Ferromagnetic Layer (CoFeB) | 314 |
| 1st Ferromagnetic Layer (CoFeB) | 312' |
| Seed Layer(s) (MgO) | 302 |

MULTI-STAGE ELEMENT REMOVAL USING ABSORPTION LAYERS

CROSS-REFERENCE TO RELATED APPLICATIONS

This application claims priority from and is a Continuation-In-Part ("CIP") of U.S. patent application Ser. No. 14/712,792, filed May 14, 2015, which in turn claims the benefit of provisional Patent Application Ser. No. 62/020,932, filed Jul. 3, 2014, entitled "MAGNETIC PROPERTIES BY REMOVAL OF ABSORPTION LAYER IN MTJ FILMS AND DUAL PATTERNING PROCESS, assigned to the assignee of the present application, and this application further claims priority from provisional Patent Application Ser. No. 62/256,102, filed Nov. 16, 2015, the contents of each of which are incorporated herein by reference in their entireties.

BACKGROUND

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-MRAM. The conventional MTJ 10 typically resides on a substrate 12. A bottom contact 14 and a top contact 22 may be used to drive current through the MTJ 10. The MTJ uses seed layer(s) and may include capping layers and an antiferromagnetic (AFM) layer (not shown). The conventional MTJ 10 includes a pinned layer 16, a tunneling barrier layer 18, and a free layer 20. Contacts 14 and 22 are used in driving the current in a current-perpendicular-to-plane (CPP) direction, or along the z-axis as shown in FIG. 1. Typically, the pinned layer 16 is closest to the substrate 12 of the layers 16, 18 and 20.

The pinned layer 16 and the free layer 20 are magnetic. The magnetization 17 of the pinned layer 16 is fixed, or pinned, in a particular direction. Although depicted as a simple (single) layer, the pinned layer 16 may include multiple layers. For example, the pinned layer 16 may be a synthetic antiferromagnetic (SAF) layer including magnetic layers antiferromagnetically coupled together through thin conductive layers, including, for instance, Ru. In such a SAF, multiple magnetic layers interleaved with thin layers of Ru may be used. In another embodiment, the coupling across the Ru layers can be ferromagnetic.

The free layer 20 has a changeable magnetization 21. Although depicted as a simple layer, the free layer 20 may also include multiple layers. For example, the free layer 20 may be a synthetic layer including magnetic layers antiferromagnetically or ferromagnetically coupled through thin conductive layers, including, for instance Ru. Although shown as perpendicular-to-plane, the magnetization 21 of the free layer 20 may alternatively be in plane. Thus, the pinned layer 16 and free layer 20 may have their magnetizations 17 and 21, respectively oriented in plane with the layers.

To switch the magnetization 21 of the free layer 20, a current is driven perpendicular to plane (in the z-direction). When a sufficient current is driven from the top contact 22 to the bottom contact 14, the magnetization 21 of the free layer 20 may switch to be parallel to the magnetization 17 of the pinned layer 16. When a sufficient current is driven from the bottom contact 11 to the top contact 22, the magnetization 21 of the free layer may switch to be antiparallel to that of the pinned layer 16. The differences in magnetic configurations correspond to different magneto-resistances and thus different logical states (e.g. a logical "0" and a logical "1") of the MTJ 10.

Because of their potential for use in a variety of applications, research in magnetic memories is ongoing. For example, mechanisms for improving the performance of STT-RAMs are desired. More specifically, MTJs providing lower switching current and higher read-out signals are desirable. Accordingly, what is needed is a method and system that may improve the performance of spin transfer torque based memories. Among other things, it would be desirable to have a method and system of producing an STT-RAM device that has improved tunneling magneto-resistance (TMR), perpendicular magnetic anisotropy (PMA), and spin wave damping properties through the reduction of boron (B) content in the MTJ layers, such as the free layer and/or the pinned layer. The method and system described herein address such a need.

BRIEF SUMMARY

Many research efforts have been directed toward obtaining a lower switching current and higher read-out signal in magnetic tunnel junction (MTJ) structures. Reduction of boron (B) content in free layer (FL) and/or pinned layer (PL) of the MTJ structure has been shown to have a positive effect on tunneling magneto-resistance (TMR), perpendicular magnetic anisotropy (PMA), and spin wave damping. In particular, deposition of a sacrificial boron-absorption layer (AL) (also referred to as an "absorption/sacrificial insertion layer", "absorption/sacrificial layer", "absorption layer", "sacrificial layer", or "insertion layer"), heat treatment (annealing) of the AL, and subsequent removal of the AL using plasma etching or ion milling has been proven to be an effective technique in reducing boron (B) content in the MTJ layers. However, this technique may have several limitations, including, for example: 1) the effectiveness of the boron (B) reduction process may be limited by the properties of the AL as well as by initial boron (B) content in the underlying layer; and 2) the underlying layer and other MTJ structures might be damaged during the heat treatment and AL removal processes. These difficulties may be mitigated, however, by performing a multi-stage element removal process to reduce the element concentration in the desired layer.

A method for providing a MTJ usable in a magnetic device and the MTJ structure are described herein. The method includes providing a free layer, a pinned layer, and a nonmagnetic spacer layer between the free layer and the pinned layer. The free layer is switchable between stable magnetic states when a write current is passed through the MTJ. The step of providing the free layer may include a first plurality of steps. The step of providing the pinned layer may include a second plurality of steps. The first and second plurality of steps may include depositing a portion of a layer (such as the free layer and/or the pinned layer), depositing a absorption/sacrificial layer, annealing the portion of the MTJ under the absorption/sacrificial layer, removing the absorption/sacrificial layer, and depositing a remaining portion of the layer.

The steps of depositing the absorption/sacrificial layer, annealing, and removing the absorption/sacrificial layer may be performed a desired number of times (for example, two or more) to effectively remove an appropriate amount of Boron (or other element) from the layer. Each removal step may include partial or complete removal of the absorption/sacrificial layer.

During the annealing process, boron (B) is diffused from the treated layer to the absorption layer. Achievement of the desired level of equilibrium distribution of boron (B) concentration after annealing depends on the absorption layer's affinity to boron, the absorption layer thickness, and the initial quantity of boron (B) in the layer being treated. Diffusion effectiveness may be increased with higher annealing temperatures, however, higher annealing temperatures might also damage some of the MTJ structures. In addition, although a thicker absorption layer may also increase the amount of boron (B) removal, a thicker absorption layer requires more a prolonged or aggressive removal process, which also increases the likelihood of damage the MTJ structure. Accordingly, there is an absolute maximum in the amount of boron (B) that can be removed by the absorption layer addition, annealing, and removal processes in a single stage.

All of the above shortcomings may be mitigated, however, by applying the absorption layer deposition, heat treatment, and removal cycle several times. A fresh absorption layer is deposited, saturated with boron (B) from the underlying layer during an annealing process, and removed during each cycle (or stage). This technique allows deeper boron (B) removal for a given absorption layer material, decreases damage to the underlying MTJ structure by lowering the required annealing temperature and milling power, and provides additional freedom for optimization and tailoring of the process parameters and conditions for specific needs by permitting variation in the conditions from cycle to cycle (or stage to stage). The cycle may be repeated until the desired level of element concentration is achieved.

Thus, the first plurality of steps may include depositing a first portion of the free layer, depositing a first absorption or sacrificial layer, annealing the first portion of the free layer and the first sacrificial layer at a first temperature greater than about 25° C., removing the first sacrificial layer, and depositing a second portion of the free layer. The first plurality of steps may further include performing the absorption/sacrificial layer deposition, annealing, and removal steps one or more additional times before depositing the remaining portion of the free layer.

The second plurality of steps may include depositing a first portion of the pinned layer, depositing a second absorption or sacrificial layer, annealing the first portion of the pinned layer and the second absorption/sacrificial layer at a second temperature greater than about 25° C., defining a portion of the MTJ including the free layer, the nonmagnetic spacer layer and the first portion of the pinned layer, removing the second absorption/sacrificial layer, and depositing a second portion of the pinned layer. The plurality of second steps may further include performing the steps of depositing a second absorption/sacrificial layer, annealing, and removal of the second absorption/sacrificial layer one or more additional times before depositing the second portion of the pinned layer.

BRIEF DESCRIPTION OF THE DRAWINGS

FIGS. 10-22 are schematic block diagrams depicting various stages of manufacturing an exemplary embodiment of a MTJ structure usable in a magnetic memory and programmable using spin transfer torque during fabrication.

DETAILED DESCRIPTION

Figure 1:
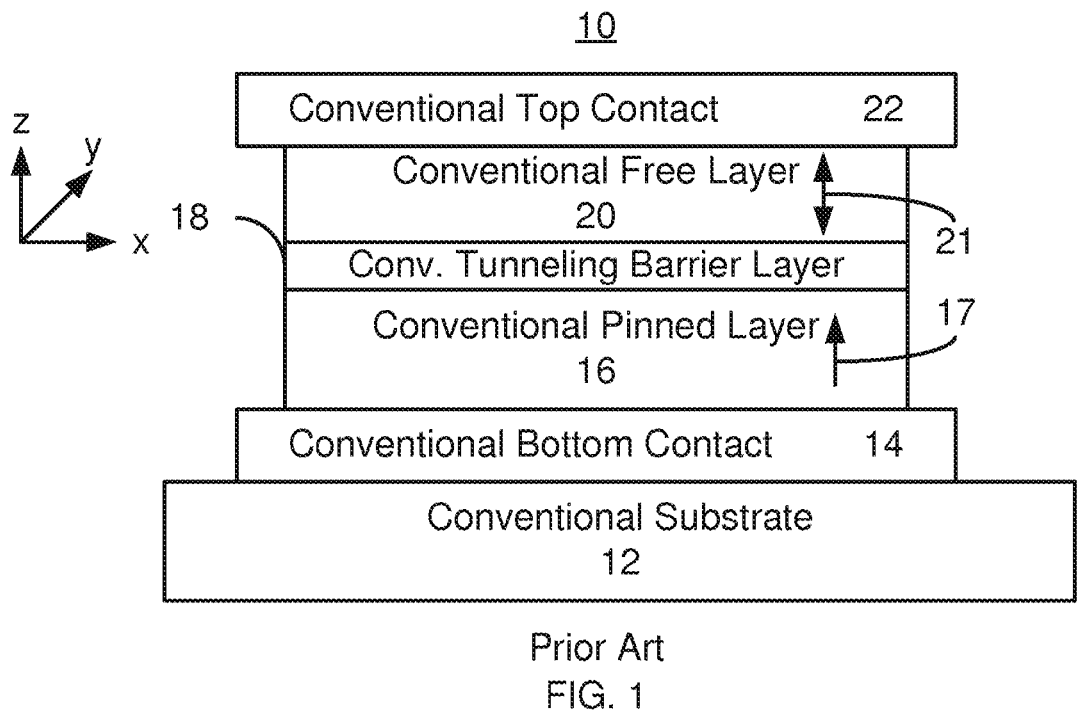
FIG. 1 is a schematic block diagram depicting a conventional magnetic tunnel junction (MTJ) structure.

The exemplary embodiments relate to MTJ structures usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices may include, but are not limited to, cellular phones, smart phones, tablets, laptops, and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent to those skilled in the art. The embodiments provided herein are exemplary of particular methods and systems provided in particular implementations. However, the methods and systems will operate effectively in other implementations.

Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or fewer components than those shown, and variations in the arrangement and type of the components may be made without departing from the scope of the invention.

The exemplary embodiments are also described in the context of the current understanding of the spin transfer phenomenon, of magnetic anisotropy, and other physical phenomenon. Consequently, one of ordinary skill in the art will readily recognize that theoretical explanations of the behavior of the method and system are made based upon this current understanding. However, the inventive concepts described herein are not dependent upon a particular physical explanation, and should not be limited thereto.

The exemplary embodiments are also described in the context of a structure having a particular relationship to the substrate. However, one of ordinary skill in the art will readily recognize that the inventive concepts are consistent with other structures. In addition, the exemplary embodiments are described with certain layers being synthetic and/or simple. However, one of ordinary skill in the art will readily recognize that the layers could have other structures, such as complex or multilayer structures.

Furthermore, the exemplary embodiments are described with the MTJ structure and/or substructures having particular layers. However, one of ordinary skill in the art will readily recognize that the MTJ structure and/or substructures may have additional and/or different layers not inconsistent with the present inventive concepts. Moreover, certain components may be described as being magnetic, ferromagnetic, and ferrimagnetic. As used herein, the term "magnetic" could include ferromagnetic, ferromagnetic, or other like structures. Thus, as used herein, the term "magnetic" or "ferromagnetic" includes, but is not limited to, ferromagnets and ferrimagnets.

In addition, as used herein, the term "in-plane" is used to mean substantially within or parallel to the plane of one or more of the layers of a MTJ. Conversely, the terms "perpendicular" and "perpendicular-to-plane" refers to a direction that is substantially perpendicular to one or more of the layers of the MTJ structure.

Exemplary embodiments will also be described in the context of particular methods having certain steps. However, the method and system may operate effectively with different and/or additional steps and/or with steps performed in different orders that are not inconsistent with the inventive concepts. Thus, the present invention is not intended to be limited to the specific embodiments shown, but is to be accorded the widest scope consistent with the principles and features described herein.

Methods and systems for providing a MTJ structure as well as a magnetic memory utilizing the MTJ structure will now be described in further detail. The exemplary embodiments provide methods for providing a MTJ structure usable in a magnetic device, and further provide a MTJ structure formed using such methods.

Figure 2:
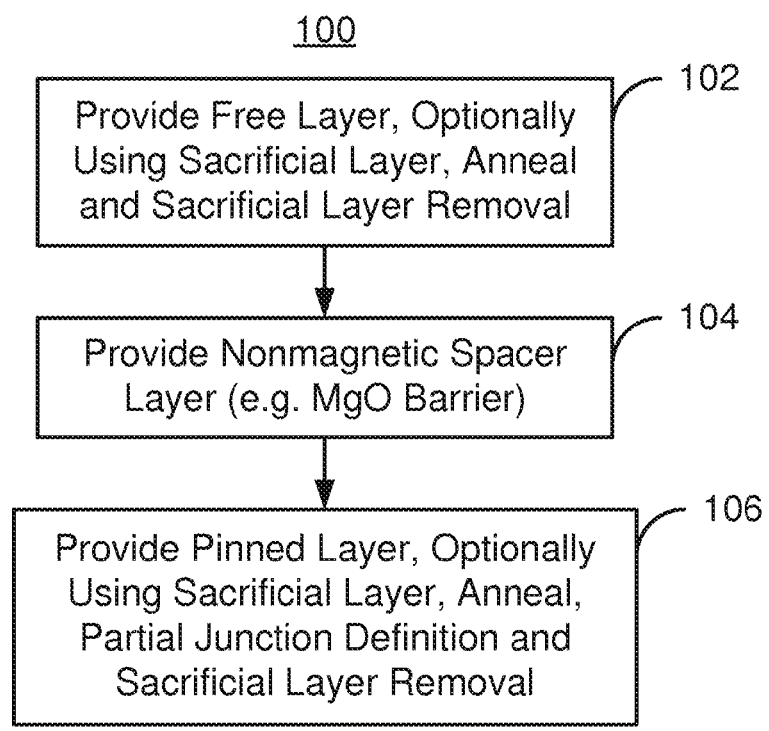
FIG. 2 is a flow chart depicting an exemplary embodiment of a method for providing a MTJ structure usable in a magnetic memory and programmable using spin transfer torque.

FIG. 2 is a flow diagram depicting an exemplary embodiment of a method 100 for fabricating a MTJ structure usable in a magnetic device such as a spin transfer torque random access memory (STT-RAM). Such STT-RAMs may be usable in a variety of electronic devices. For simplicity, some steps may be omitted, performed in another order, or combined. Further, the method 100 may start after other steps in forming a magnetic memory have already been performed.

Referring to FIG. 2, a free layer is provided, via step 102. Step 102 may, for instance, include depositing the material(s) for the free layer. The free layer may be deposited on a seed layer(s). The seed layer(s) may be selected for various purposes including, but not limited to, providing the desired crystal structure of the free layer, and providing magnetic anisotropy and/or magnetic damping of the free layer. For example, the free layer may be provided on a seed layer such as a crystalline MgO layer that promotes a perpendicular magnetic anisotropy in the free layer. If a dual MTJ structure is fabricated, the free layer may be formed on another nonmagnetic spacer layer. This nonmagnetic spacer layer may be the MgO seed layer discussed above. A pinned layer may be formed under such a spacer layer.

It may be desirable for the free layer provided in step 102 to have a perpendicular magnetic anisotropy that exceeds its demagnetization energy. The magnetic moment of the free layer may thus be stable out-of-plane, including perpendicular-to-plane. In addition, a polarization enhancement layer (PEL) may be provided as part of, or in addition to, the free layer. A PEL may include high spin polarization materials. The free layer provided in step 102 is configured to be switched between stable magnetic states when a write current is passed through the MTJ. Thus, the free layer is switchable utilizing spin transfer torque. The free layer is magnetic and is preferably thermally stable at desired operating temperatures. Although step 102 is discussed in the context of providing a free layer, the edges of the free layer may be defined at a later time during formation of a stack.

In some embodiments, the formation of the free layer in step 102 may include additional steps. For instance, a first ferromagnetic layer providing a first portion of the free layer may be deposited first. The first portion of the free layer may include a magnetic layer including cobalt (Co), iron (Fe), and/or boron (B). For example, a CoFeB layer, having not more than twenty atomic percent B, may be deposited. In such cases, step 102 also preferably includes depositing an absorption/sacrificial insertion layer on the first ferromagnetic layer such that the layers share an interface.

The absorption/sacrificial insertion layer may include one or more materials that have an affinity for boron (B), that have a low diffusion, and that are a relatively good lattice match for the underlying layer. For example, the difference in lattice parameters between the underlying ferromagnetic layer and the absorption/sacrificial insertion layer may be less than ten percent. The absorption/sacrificial insertion layer may be thin, for example, less than ten Angstroms thick. In some such embodiments, the absorption/sacrificial insertion layer may not exceed five Angstroms thick and may be greater than one Angstrom thick. For example, the absorption/sacrificial insertion layer may be approximately four Angstrom thick. In other embodiments, other thickness(es) may be used.

After the addition of the absorption/sacrificial insertion layer, the insertion layer and underlying layer(s) are then preferably annealed at temperature(s) above room temperature (e.g., above 25° C.). For example, a rapid thermal anneal (RTA) at temperature(s) in the range of approximately between about 300-500° C. may be performed. Higher temperatures may be used in the RTA, for example if a shorter time is used or a MTJ structure having a bottom free layer is fabricated. In other embodiments, the annealing process may be performed in another manner, including but not limited to block heating. The annealing process may also be performed at other temperature(s).

After the annealing process, the absorption/sacrificial insertion layer is partially or completely removed, for example, via a plasma etch process. In some cases, part of the absorption/sacrificial insertion layer may be pushed into the underlying layer by the plasma etch. In other embodiments, the absorption/sacrificial insertion layer may be removed in another manner, such as ion milling, chemical mechanical planarization (CMP), or other processes. In the removal step, some portion of the underlying ferromagnetic layer may also be removed.

FIGS. 26-29 are flow charts and schematic block diagrams illustrating steps of the MTJ structure manufacturing process according to alternative embodiments. Referring additionally to FIGS. 26-29, in some embodiments, the absorption layer addition and removal processes may be performed multiple times (i.e., in multiple stages) to increase the effectiveness of the boron (B) removal process and to further reduce the boron (B) content in the underlying layer. For example, the steps of adding the absorption/sacrificial insertion layer, annealing, and removing the absorption/sacrificial insertion layer may be performed multiple times (i.e., two or more times), with each set of absorption layer addition, annealing, and removal processes providing one stage in the multi-stage element removal process.

During each stage of the multi-stage removal process, the absorption/sacrificial insertion layer may be wholly or partly removed before depositing the next absorption/sacrificial insertion layer. In addition, the process conditions may be varied during each stage. For instance, a thickness of the added absorption/sacrificial insertion layer may be varied during subsequent stages of the process and a temperature of the annealing process may also be varied. Other parameters and conditions of the processes may likewise be varied among the different stages in the multi-stage removal process.

In any case, the total amount of magnetic material present (determined by the thickness of the free layer) following the removal process, should be such that the perpendicular magnetic anisotropy exceeds the demagnetization energy. The critical thickness will vary depending on several factors including the materials used, the structure, and the interfaces.

Figure 29:
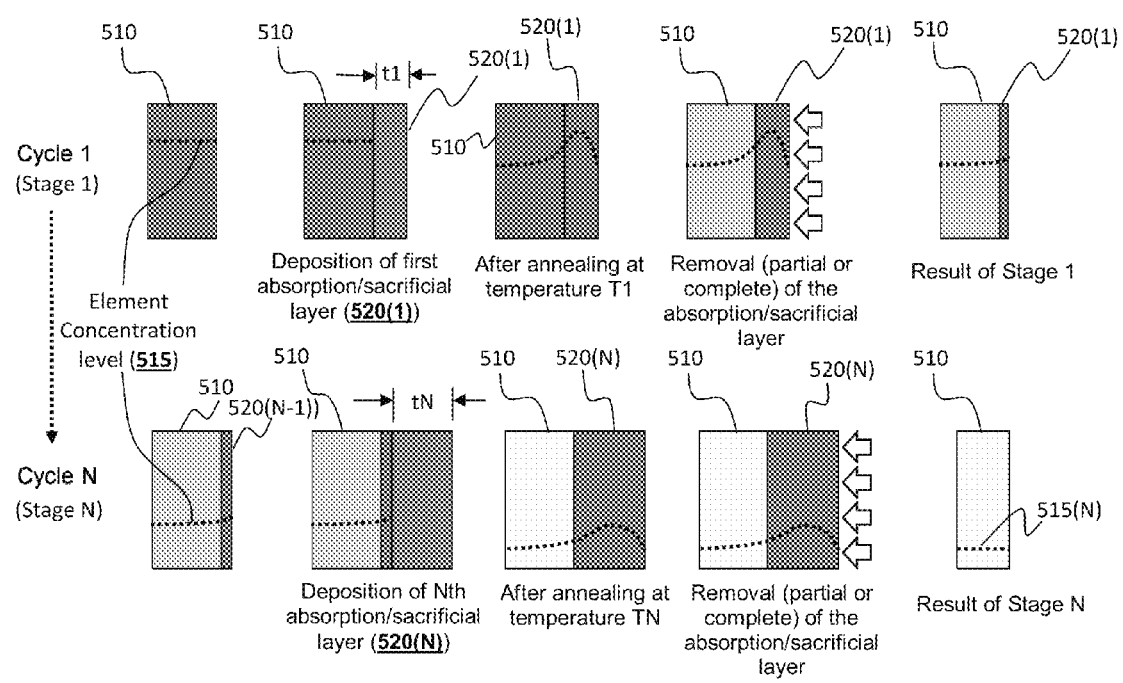
FIG. 29 is a schematic block diagram and graph illustrating a multi-stage element removal process along with an element concentration level in a layer of the MTJ structure and absorption layer at various stages of the multi-stage element removal process.

As can be seen particularly in FIG. 29, by performing multiple stages of the absorption layer addition, annealing, and removal processes, the element concentration level in the underlying layer can be more effectively reduced. More particularly, by repeatedly applying to, annealing, and removing a boron (B) absorption layer from the underlying layer, a desired amount of boron (B) can be removed from the underlying layer, and a remaining concentration amount of boron (B) in the underlying layer can be sufficiently low to permit more effective operation of the MTJ structure. In addition, the drawbacks of systems employing only a single absorption layer addition, annealing, and removal process can be avoided.

Referring back to FIG. 2, after the final removal process, a remaining portion of the free layer, if any, may then be deposited. For example, a second ferromagnetic layer may be deposited on the exposed first ferromagnetic layer. This second ferromagnetic layer may be another CoFeB layer. In some embodiments, the total amount of magnetic material provided may allow the free layer to have a perpendicular magnetic anisotropy that exceeds the demagnetization energy. For example, the first and second ferromagnetic layers together at the end of step 102 may have a total thickness that is greater than fifteen Angstroms but does not exceed thirty Angstroms. In some such embodiments, the total thickness may not exceed twenty-five Angstroms. For example, the total thickness may be at least sixteen Angstroms and less than twenty Angstroms. In other embodiments, the free layer may be formed in another manner.

A nonmagnetic spacer layer may be provided, via step 104. In some embodiments, a crystalline MgO tunneling barrier layer may be desired for the MTJ being formed. Step 104 may include depositing MgO, which forms a tunneling barrier layer. In some embodiments, step 104 may include depositing MgO using, for example, radio frequency (RF) sputtering. Metallic Mg may be deposited and then oxidized in step 104 to provide a natural oxide of Mg. The MgO barrier layer/nonmagnetic spacer layer may also be formed in another manner.

As discussed above with respect to step 102, the edges of the nonmagnetic spacer layer may be defined at a later time, for example after deposition of the remaining layer of the MTJ. Step 104 may include annealing the portion of the MTJ already formed to provide crystalline MgO tunneling barrier with a (100) crystalline structure orientation for enhanced tunneling magnetoresistance (TMR) of the MTJ.

A pinned layer may also be provided, via step 106. The nonmagnetic spacer layer may be arranged between the pinned layer and the free layer. In some embodiments, the pinned layer is formed in step 106 after formation of the free layer in step 102. In other embodiments, the pinned layer may be formed first. The pinned layer is magnetic and may have its magnetization pinned, or fixed, in a particular direction during at least a portion of the operation of the MTJ. The pinned layer may thus be thermally stable at operating temperatures. The pinned layer formed in step 106 may be a simple (single) layer or may include multiple layers. For example, the pinned layer formed in step 106 may be a SAF including magnetic layers antiferromagnetically or ferromagnetically coupled through thin nonmagnetic layer(s), such as Ru. In such a SAF, each magnetic layer may also include multiple layers. The pinned layer may also be another multilayer. The pinned layer formed in step 106 may have a perpendicular anisotropy energy that exceeds the out-of-plane demagnetization energy. Thus, the pinned layer may have its magnetic moment oriented perpendicular to plane. Other orientations of the magnetization of the pinned layer are possible. In addition, it is noted that other layers, such as a PEL or coupling layer(s) may be inserted between the pinned layer and the nonmagnetic spacer layer.

In some embodiments, step 106 may include multiple steps analogous to those described above for step 102. For example, a first portion of the pinned layer may be deposited first. The first portion of the pinned layer may include a magnetic layer including Co, Fe, and/or B. For example, a CoFeB layer, having, for example, not more than twenty atomic percent B, may be deposited. A PEL or other structure may also have been deposited between the pinned layer and the nonmagnetic spacer layer.

Step 106 may further include depositing an absorption/sacrificial insertion layer on the portion of the pinned layer that has been formed. In some embodiments, the absorption/sacrificial insertion layer is deposited directly on the ferromagnetic layer. In other embodiments, other layer(s) may be deposited between the ferromagnetic layer and the sacrificial insertion layer. The absorption/sacrificial insertion layer may include material(s) that have an affinity for boron, that have a low diffusion, and that are a relatively good lattice match for the underlying layer. For example, the difference in lattice parameters between the underlying ferromagnetic layer and the sacrificial insertion layer may be less than ten percent. The absorption/sacrificial insertion layer may be thin. In some embodiments, the absorption/sacrificial insertion layer may have approximately the same thickness as the absorption/sacrificial layer described above for the free layer. In other embodiments, other thickness(es) may be used. The absorption/sacrificial insertion layer may be continuous to allow for patterning, as discussed below.

After depositing, the absorption/sacrificial insertion layer and underlying layer(s) may then be annealed at a temperature(s) above room temperature. For example, an RTA at a temperature(s) in the range of approximately between about 300-500° C. may be used. In other embodiments, the annealing process may be performed in another manner. The annealing process may be analogous to that described above in step 102. After the annealing process, the portion of the MTJ under the absorption/sacrificial insertion layer may be defined.

For example, edges of the MTJ may be defined using a photolithographic mask and an ion mill or other mechanism for etching the layers. A nonmagnetic insulating layer such as alumina may be deposited to refill the region around the MTJ. A planarization process might also be performed. The absorption/sacrificial layer may then be removed, for example via plasma etching. Other removal methods may also be used. In the removal step, some portion of the underlying ferromagnetic layer may be removed.

As with the formation of the free layer, a multi-stage absorption/sacrificial insertion layer addition, annealing, and removal process may be applied to the pinned layer. Again referring to FIGS. 27-29, in some embodiments, the absorption/sacrificial insertion layer addition and removal processes may be performed multiple times (i.e., in multiple stages) on the pinned layer to increase the effectiveness of the boron (B) removal process and to further reduce the boron (B) content in the underlying layer. For example, the steps of adding the absorption/sacrificial insertion layer, annealing, and removing the absorption/sacrificial insertion layer may be performed multiple times (i.e., two or more times), with each set of absorption layer addition, annealing, and removal processes providing one stage in the multi-stage element removal process.

During each stage of the multi-stage removal process, the absorption layer may be wholly or partly removed before depositing the next absorption layer. In addition, the process conditions may be varied during each stage. For instance, a thickness of the added absorption/sacrificial insertion layer may be varied during each subsequent stage of the process, and a temperature of the annealing process may also be different in the subsequent stages. Other parameters and conditions of the processes may likewise be varied among the different stages in the multi-stage removal process.

As can be seen particularly in FIG. 29, by performing multiple stages of the absorption layer addition, annealing, and removal processes, the element concentration level in the underlying layer can be more effectively reduced. More particularly, by repeatedly applying to, annealing, and removing a boron (B) absorption layer from the underlying layer, a desired amount of boron (B) can be removed from the underlying layer, and a remaining concentration amount of boron (B) in the underlying layer can be sufficiently low to permit more effective operation of the MTJ structure. In addition, the drawbacks of systems employing only a single absorption layer addition, annealing, and removal process can be avoided.

Figure 7:
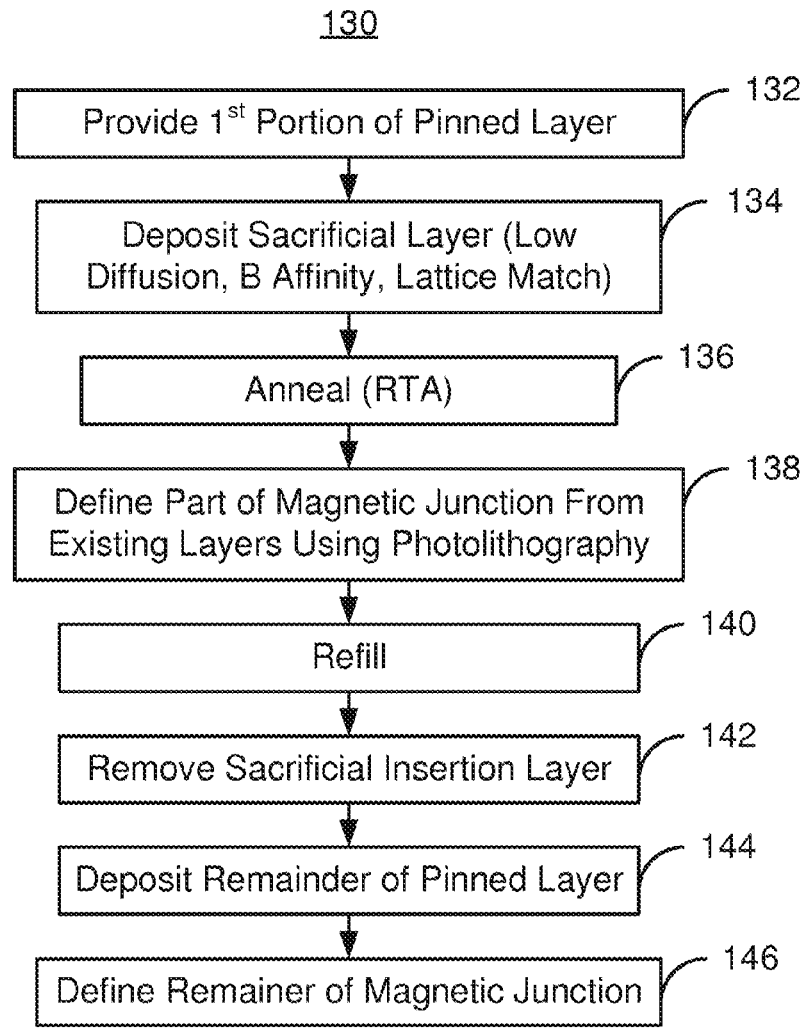
FIG. 7 is a flow diagram illustrating another exemplary embodiment of a method for providing a MTJ structure usable in a magnetic memory and programmable using spin transfer torque.

After the final absorption/sacrificial layer removal process has been performed, the remainder of the pinned layer, if any, may then be deposited (see FIG. 7). For example, additional ferromagnetic layer(s) may be deposited directly on the exposed first ferromagnetic layer. In embodiments in which the pinned layer is a SAF, is a nonmagnetic layer such as Ru may be deposited and another magnetic layer provided on the nonmagnetic layer. In other embodiments, the pinned layer may be formed in another manner.

Figure 3:
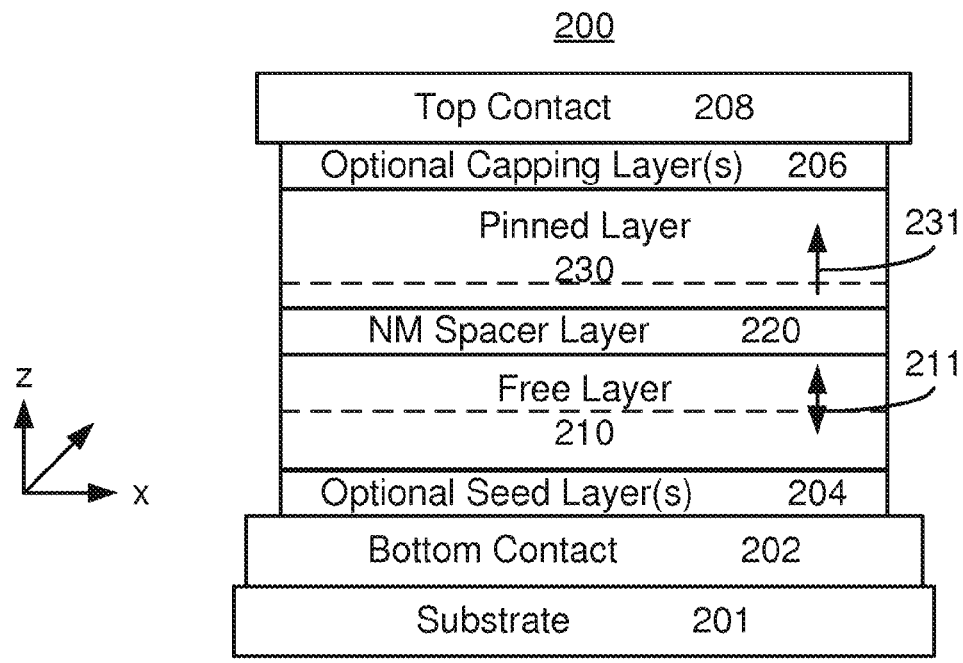
FIG. 3 is a schematic block diagram illustrating an exemplary embodiment of a MTJ structure usable in a magnetic memory and programmable using spin transfer torque.

FIG. 3 is a schematic diagram depicting an exemplary embodiment of a MTJ structure 200 that may be fabricated using the method 100, as well as surrounding structures. FIG. 3 is not to scale, and the relative sizes and thicknesses of the different layers and regions may vary from that depicted. The MTJ structure 200 may be used in a magnetic device such as a STT-RAM and, therefore, in a variety of electronic devices. The MTJ structure 200 may include a free layer 210 having magnetic moment 211, a nonmagnetic spacer layer 220, and a pinned layer 230 having magnetic moment 231. Also shown is an underlying substrate 201 in which devices including, but not limited to, a transistor may be formed. Bottom contact 202, top contact 208, optional seed layer(s) 204 and optional capping layer(s) 206 are also shown. As can be seen in FIG. 3, the pinned layer 230 may be arranged closer to the top (i.e., furthest from a substrate 201) of the MTJ structure 200.

An optional pinning layer (not shown) may be used to fix the magnetization (not shown) of the pinned layer 230. In some embodiments, the optional pinning layer may be an AFM layer or multilayer that pins the magnetization (not shown) of the pinned layer 230 by an exchange-bias interaction. However, in other embodiments, the optional pinning layer may be omitted or another structure may be used.

In some embodiments, the orientation of the pinned layer 230 and free layer 210 with respect to the substrate 201 may be reversed. In other words, the pinned layer 230 may be arranged closer to the substrate than the free layer 210.

In the embodiment shown in FIG. 3, the perpendicular magnetic anisotropy energy of the pinned layer 230 and of the free layer 210 each exceed the out of plane demagnetization energy of the pinned layer 230 and free layer 210, respectively. Consequently, the magnetic moments 211 and 231 of the free layer 210 and the pinned layer 230, respectively, may be arranged perpendicular to plane. Stated differently, the stable magnetic states for the free layer 231 may be with the moment oriented in the +z direction or the −z direction. In FIG. 3, the free layer 210 and pinned layer 230 each include a dashed line indicating that the portions of the layer 210 and/or 230 may be formed separately, such as with the use of a sacrificial insertion layer that is removed prior to completion of the MTJ structure 200.

The MTJ structure 200 is preferably configured to allow the free layer 210 to be switched between stable magnetic states when a write current is passed through the MTJ structure 200. Thus, the magnetic orientation of the free layer 210 is switchable utilizing spin transfer torque when a write current is driven through the MTJ structure 200 in a current perpendicular-to-plane (CPP) direction. The direction of magnetization of the free layer 210, and thus the data stored in the MTJ structure 200, may be read by driving a read current through the MTJ structure 200. The read current may also be driven through the MTJ structure 200 in the CPP direction. Thus, the magnetoresistance of the MTJ structure 200 provides the read signal.

The MTJ structure 200 and free layer 210 fabricated according to principles of the present inventive concepts may have improved performance due to fabrication using the step(s) 102 and/or 106. Some of the potential benefits are described below with respect to particular physical mechanisms. However, one of ordinary skill in the art will readily recognize that the method and system described herein are not dependent upon a particular physical explanation.

If the free layer 210 is formed using an absorption/sacrificial insertion layer such as provided in step 102, the free layer 210 may be made thicker, and still have perpendicular-to-plane stable states for the magnetic moment 211, improved magnetoresistance, and/or less damping. By using a multi-stage removal process, these benefits can be increased.

If, however, the MTJ structure 200 is formed without an absorption/sacrificial insertion layer, the free layer must generally be kept to not more than approximately twelve Angstroms thick in order to maintain a perpendicular-to-plane magnetic moment. For example, a ferromagnetic CoFeB layer that is approximately fifteen Angstroms thick has an in-plane magnetic moment. Although a thinner free layer has a perpendicular-to-plane magnetic moment, magnetoresistance may be reduced. This reduction may be particularly noticeable if the free layer is arranged between two MgO layers, such as an MgO seed layer and an MgO nonmagnetic spacer layer. It is believed that the reduction in tunneling magnetoresistance may be due to conflicts in the crystallinity of the free layer and MgO layers.

Alternatively, a free layer might be formed with a permanent insertion layer between two magnetic layers. Such a free layer may have a total thickness of greater than twelve Angstroms. The magnetic layers are still separated by the permanent insertion layer. Each of the magnetic layers is still on the order of not more than about twelve Angstroms thick in order to maintain the perpendicular-to-plane magnetic moment. Such thinner magnetic/free layers may have a perpendicular-to-plane magnetic moment. In addition, magnetoresistance may be improved. For example, a permanent insertion layer such as W may reduce conflicts between the crystallinity of surrounding layers, such as MgO layers, and the free layer. This may allow for a higher magnetoresistance. However, damping may be higher than desired. Such a high damping may increase the switching current (write current required to switch the state of the magnetic moment of the free layer). A higher switching current is generally undesirable. Thus, performance for such a MTJ structure may suffer.

In contrast, the MTJ structure 200 according to principles of the present inventive concepts may have improved magnetoresistance due the use of the absorption/sacrificial insertion layer (not shown in FIG. 3) during fabrication. Use of the absorption/sacrificial insertion layer and subsequent annealing of the bottom portion of the free layer 210 may allow for crystallization of the free layer 210 prior to formation of the nonmagnetic spacer layer 220. It is believed that this may be due at least in part to the affinity of the absorption/sacrificial insertion layer for B and O that may otherwise be left in the free layer 210 and impede crystal formation. By adding and removing an absorption/sacrificial insertion layer, the free layer 210 may be fabricated having a larger thickness while still maintaining the desired crystal structure and perpendicular anisotropy. These benefits can be further enhanced through a multi-stage absorption layer addition and removal process as described above.

For example, according to principles of the present inventive concepts, the free layer 210 may be formed having a thickness greater than fifteen Angstroms, but still may have a perpendicular-to-plane magnetic moment 231. In some embodiments, the free layer 210 is not more than twenty-five Angstroms thick. For example, the free layer 210 may be at least sixteen Angstroms thick and not more than twenty Angstroms thick. The MTJ structure 200 may thus have a higher magnetoresistance than conventional MTJ structures. Removal of the absorption/sacrificial insertion layer may also reduce the damping in the free layer 210. The free layer 210 may therefore exhibit a lower switching current, and, in such cases, a smaller write current may be used in programming the MTJ. Performance may thus be improved.

The fabrication of the pinned layer 230 in step 106 may also improve performance of the MTJ 200 in a magnetic device. Because the bottom layers 204, 210, 220, and part of 230, may be defined prior to the entire pinned layer 230 being deposited, a thinner part of the MTJ 200 may be removed during this definition step. Accordingly, shadowing due to magnetic influences of nearest neighbor MTJs in a magnetic device during this definition step may thereby be mitigated. Similar benefits may be achieved when defining the remaining portion of the MTJ structure 200, such as the remaining portion of the layer 230 and the capping layer(s) 206. Thus, the MTJ structure 200 may be placed closer to another MTJ (not shown in FIG. 3) without adversely affecting fabrication. Consequently, the manufacturing process may be improved and a more densely packed memory device achieved. If both steps 102 and 106 use the absorption/sacrificial insertion layer, then benefits described above for both performance of the MTJ and the packing/fabrication of the magnetic device may be achieved. These benefits may be enhanced by performing a multi-stage absorption/sacrificial insertion layer addition and removal process.

Figure 4:
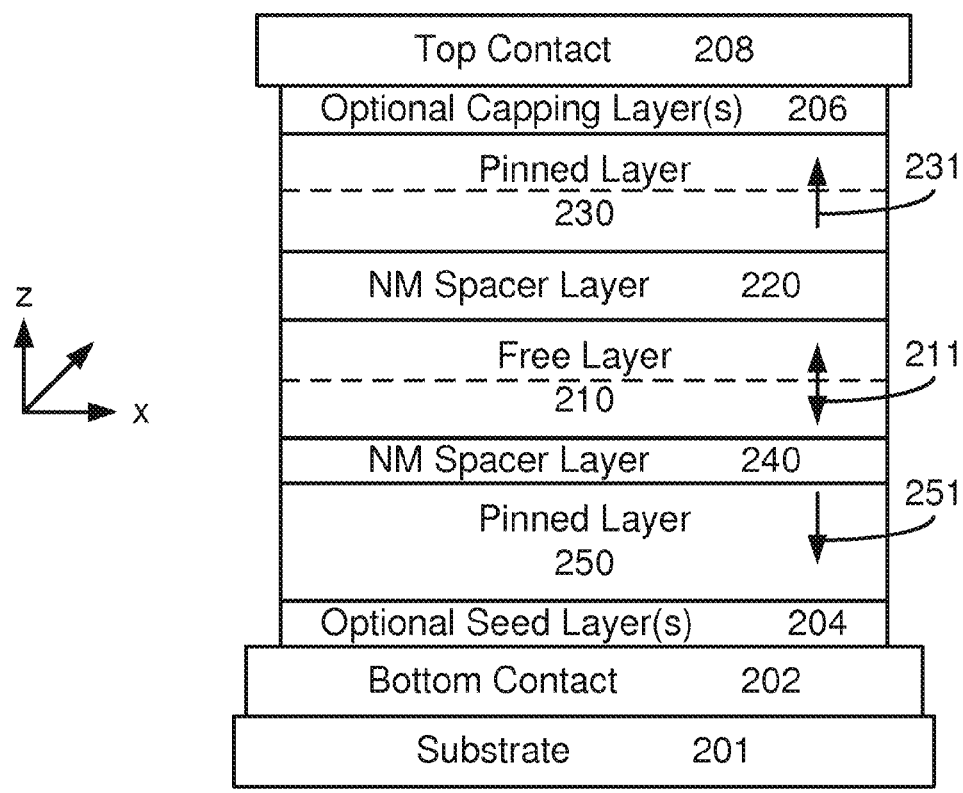
FIG. 4 is a schematic block diagram depicting another exemplary embodiment of a MTJ structure usable in a magnetic memory and programmable using spin transfer torque.

FIG. 4 is a schematic block diagram of an exemplary embodiment of a MTJ structure 200' that may be fabricated using the method 100 which further illustrates surrounding structures. Again, the sizes and shapes of features and regions may be enhanced for clarity, and FIG. 4 is therefore not to scale. The MTJ structure 200' may be used in a magnetic device such as a STT-RAM and, therefore, in a variety of electronic devices. The MTJ structure 200' is analogous to the MTJ 200. Consequently, similar components have analogous labels.

The MTJ structure 200' includes a free layer 210 having a magnetic moment 211, a nonmagnetic spacer layer 220, and a pinned layer 230 having a magnetic moment 231, each of which are analogous to corresponding elements of the MTJ structure 200 of FIG. 3. An underlying substrate 201, bottom contact 202, top contact 208, optional seed layer(s) 204 and optional capping layer(s) 206 are also analogous to the corresponding features and elements of FIG. 3.

Unlike the MTJ of FIG. 3, however, the MTJ structure 200' shown in FIG. 4 is a dual MTJ structure. Thus, the MTJ 200' includes an additional nonmagnetic spacer layer 240 and an additional pinned layer 250 as compared to the MTJ structure 200 of FIG. 3. The pinned layer 250 may be analogous to the pinned layer 230. Thus, the pinned layer 250 may have a perpendicular-to-plane magnetic moment 250.

In the embodiment shown, the MTJ structure 200' is in a dual state. Thus, the magnetic moments 231 and 251 are antiparallel to each other. In another embodiment, the magnetic moments 231 and 251 may be in an antidual, or parallel, state. In still other embodiments, the magnetic moments 231 and 251 may be switched between the antidual and dual states during operation. A second nonmagnetic spacer layer 240 may be analogous to the first nonmagnetic spacer layer 220. However, the second nonmagnetic spacer layer 240 may be formed having a different thickness and/or formed of different material(s) from the first nonmagnetic spacer layer 220. For example, the first and second spacer layers 220 and 240 may both be formed of (100) MgO. However, one layer, such as the second nonmagnetic spacer layer 240, may be thinner than the other layer. In some embodiments, the second layer 240 may be on the order of thirty percent thinner than the first layer 220.

The dual MTJ structure 200' may share the same benefits as the MTJ structure 200. In other words, when formed according to principles of the present inventive concepts, the dual MTJ structure 200' may have improved magnetoresistance, reduced damping and switching current, and/or may be packed more densely in a magnetic device. These benefits can be enhanced through a multi-stage absorption layer addition and removal process.

Figure 5:
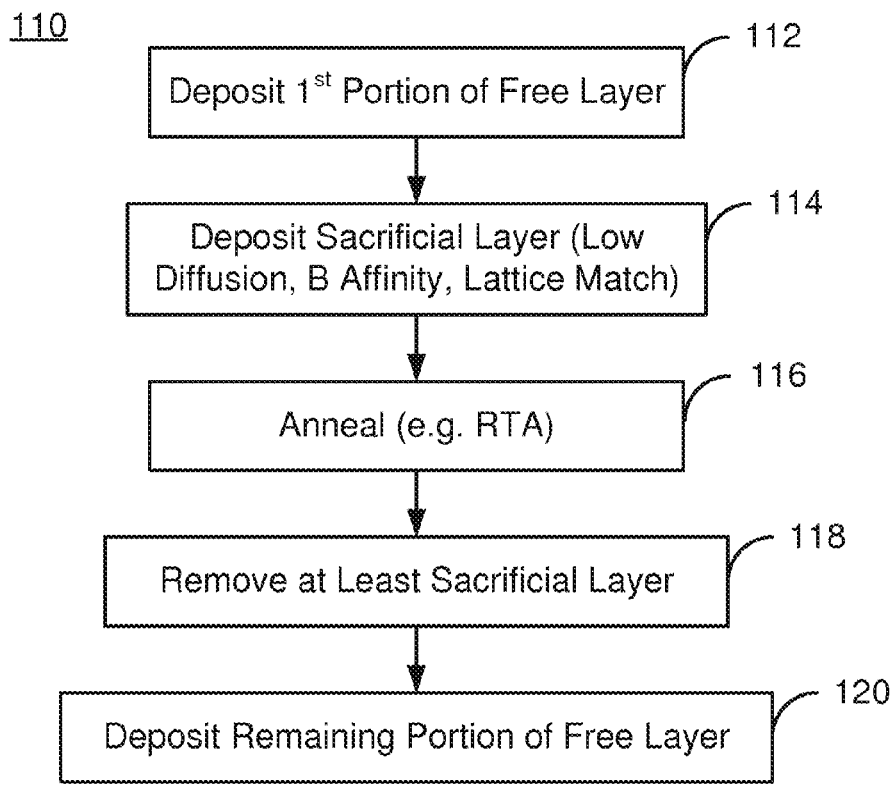
FIG. 5 is a flow diagram depicting another exemplary embodiment of a method for providing a portion of a MTJ structure usable in a magnetic memory and programmable using spin transfer torque.

FIG. 5 is a flow chart illustrating a method 110 for fabricating a portion of a MTJ structure usable in a magnetic device such as a STT-RAM and, therefore, in a variety of electronic devices. For simplicity, some steps may be omitted, performed in another order, or combined with other steps. Further, the method 110 may start after other steps in forming a magnetic memory have already been performed. The method 110 may be used, for example, in performing the step 102 of the method 100. However, in other embodiments, the method 110 may be used in fabricating another portion of the MTJ structure 200, such as the pinned layer, and/or may be used in connection with another fabrication process altogether.

Referring to FIG. 5, the method 110 may start after one or more other layers, such as one or more seed layers have been formed. For example, in one embodiment, the method 110 commences after a crystalline MgO seed layer having a (100) orientation has been deposited. If a dual MTJ structure is being fabricated, the MgO "seed" layer may be another nonmagnetic spacer layer that has been formed on a pinned layer. In addition, a PEL may be provided as part of, or in addition to, the free layer.

A first portion of the free layer is deposited, via step 112. The first portion of the free layer may include a magnetic layer including Co, Fe, and/or B. For example, a CoFeB layer, having not more than about twenty atomic percent B, may be deposited. In some embodiments, the thickness of this ferromagnetic layer may be up to approximately twenty-five Angstroms. In some embodiments, the ferromagnetic layer may be at least about fifteen Angstroms. However in other embodiments, other thicknesses and/or other layers are possible.

An absorption/sacrificial insertion layer may be deposited on the first ferromagnetic layer such that the layers share an interface, via step 114. The absorption/sacrificial insertion layer may include one or more materials that have an affinity for boron (B), that have a low diffusion, and that are a relatively good lattice match for the underlying CoFeB layer. For example, the difference in lattice parameters between the underlying ferromagnetic layer and the absorption/sacrificial insertion layer may be less than about ten percent.

The absorption/sacrificial insertion layer may, for instance, include one or more of Bi, W, I, Zn, Nb, Ag, Cd, Hf, Os, Mo, Ca, Hg, Sc, Y, Sr, Mg, Ti, Ta, Ba, K, Na, Rb, Pb, and Zr. In some embodiments, for example, the sacrificial insertion layer may consist of Bi, W, I, Zn, Nb, Ag, Cd, Hf, Os, Mo, Ca, Hg, Sc, Y, Sr, Mg, Ti, Ba, Ta, K, Na, Rb, Pb, and/or Zr. In some embodiments, Ta and/or W may specifically be used. Ta and/or W sacrificial insertion layers, for example, sufficiently match the lattice for the underlying CoFeB layer, have a sufficiently high boron affinity, and have a sufficiently low diffusion.

The absorption/sacrificial insertion layer may be thin, for example less than about ten Angstroms thick. In some such embodiments, the absorption/sacrificial insertion layer may not exceed about five Angstroms thick and is greater than about one Angstrom thick. The absorption/sacrificial insertion layer may, for example, be approximately four Angstroms thick. In other embodiments, however, other thicknesses and/or materials may be used.

The absorption/sacrificial insertion layer and underlying layer(s) may then be annealed at a temperature(s) above room temperature, via step 116. For example, an RTA at temperature(s) in the range of approximately between about 300-500° C. may be used. In other embodiments, the annealing process may be performed in other manners and/or at other temperatures. The annealing process of step 116 may be performed such that the underlying CoFeB layer, which is amorphous as deposited, crystallizes with the desired structure and orientation. In addition, excess boron (B) in the CoFeB layer and/or excess oxygen (O) in the ferromagnetic layer may be absorbed by the insertion layer during the annealing process. For example, it is believed that during annealing the B in the CoFeB layer diffuses, and forms a BCC structure having a (001) orientation. In general, it may be desirable to delay this crystallization in order to improve TMR. Thus, the CoFeB layer may be desired to be amorphous until the annealing process.

After the annealing process, the absorption/sacrificial insertion layer is removed, via step 118. For example, a plasma etch process may be used. In other embodiments, the absorption/sacrificial insertion layer may be removed in another manner including but not limited to ion milling or chemical mechanical planarization processes. During the removal process in step 118, some portion of the underlying CoFeB layer may be removed.

After step 118, the remaining thickness of the CoFeB layer may be desired to be greater than zero but not more than about fifteen Angstroms. In some embodiments, the remainder of the CoFeB layer formed in step 112 may be not more than about twelve Angstroms thick. In some such embodiments, the CoFeB layer is not more than about ten Angstroms thick after step 118. However, complete removal of the CoFeB layer is undesirable.

According to additional principles of the present inventive concepts, a multi-stage absorption/sacrificial layer deposition, annealing, and removal process may be performed to improve the benefits achieved by the application and removal of the sacrificial layer. For instance, as shown in FIGS. 26-29, in some embodiments, the absorption/sacrificial layer addition and removal processes may be performed multiple times (i.e., in multiple stages) on the pinned layer to increase the effectiveness of the boron (B) removal process and to further reduce the boron (B) content in the underlying layer. For example, the steps of adding the absorption/sacrificial layer, annealing, and removing the sacrificial layer may be performed multiple times (i.e., two or more times), with each set of absorption/sacrificial layer addition, annealing, and removal processes providing one stage in the multi-stage element removal process.

During each stage of the multi-stage element removal process, the absorption/sacrificial layer may be wholly or partly removed before depositing the next absorption/sacrificial layer. In addition, the process conditions may be varied during each stage. For instance, a thickness of the added absorption/sacrificial layer may be varied between process stages, and a temperature of the annealing process may also be different in the separate stages. Other parameters and conditions of the processes may likewise be varied among the different stages in the multi-stage element removal process.

Again, as can be seen particularly in FIG. 29, by performing multiple stages of the absorption layer addition, annealing, and removal processes, the element concentration level in the underlying layer can be more effectively reduced. More particularly, by repeatedly applying a boron (B) absorption layer to, annealing, and removing the boron (B) absorption layer from the underlying layer, a desired amount of boron (B) can be removed from the underlying layer, and a remaining concentration amount of boron (B) in the underlying layer can be sufficiently low to permit more effective operation of the MTJ structure. In addition, improvement can be made over systems employing only a single absorption layer addition, annealing, and removal process.

Referring back to FIG. 5, after the final removal process, the remainder of the free layer, if any, may then be deposited, via step 120. For example, a second CoFeB ferromagnetic layer may be deposited on the exposed first ferromagnetic layer. Thus, the first and second magnetic (e.g., CoFeB) layers may share an interface. Alternatively, another layer, for example including a multilayer, may be formed. Despite the total amount of magnetic material present, the free layer should have a perpendicular magnetic anisotropy that exceeds the demagnetization energy. The remaining portion of the first ferromagnetic layer after step 118 and the second ferromagnetic layer provided in step 120 together may, for example, have a total thickness that is greater than about fifteen Angstroms. The total thickness of these two layers in some embodiments may not exceed about thirty Angstroms. In some such embodiments, for instance, the total thickness does not exceed about twenty-five Angstroms. For example, the total thickness may be at least about sixteen Angstroms and less than about twenty Angstroms. In some embodiments, the thicknesses of each of the first and second ferromagnetic layers are not more than about fifteen Angstroms thick.

Figure 6:
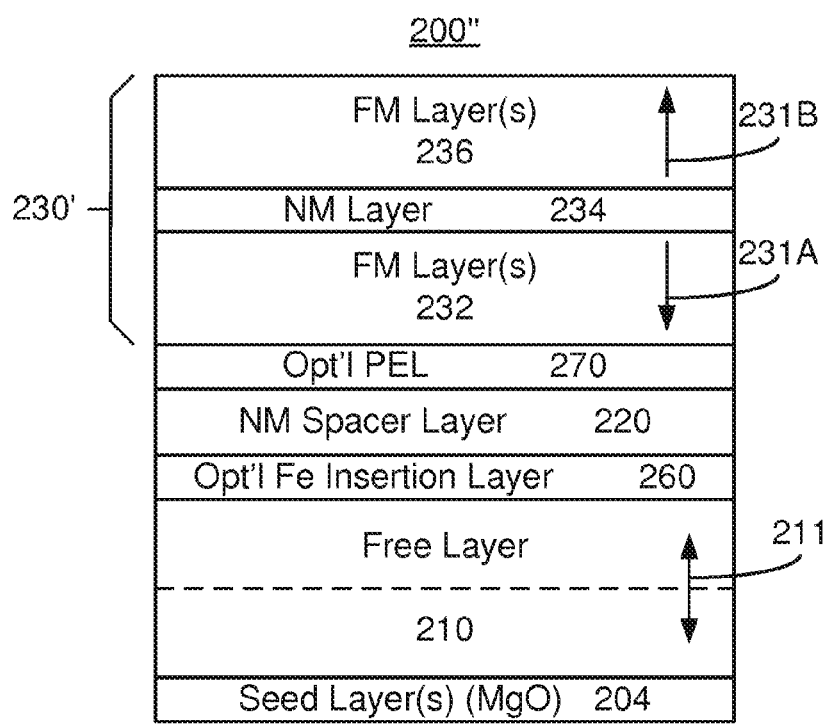
FIG. 6 is a schematic block diagram showing an exemplary embodiment of a MTJ structure usable in a magnetic memory and programmable using spin transfer torque.

FIG. 6 is a schematic block diagram of an exemplary embodiment of a MTJ structure 200" that may be fabricated using the method 110 of FIG. 5. The sizes and shapes of features and regions in FIG. 6 are not shown to scale. The MTJ structure 200" may be used in a magnetic device such as a STT-RAM and, therefore, in a variety of electronic devices. The MTJ structure 200" is analogous in many respects to the MTJ structure 200. Consequently, similar components have analogous labels.

Referring to FIG. 6, the MTJ 200" includes a free layer 210' having magnetic moment 211', a nonmagnetic spacer layer 220, and a pinned layer 230' having magnetic moments 231A/231B. These features are analogous to the corresponding features depicted in the MTJ 200. Also shown is an underlying optional seed layer(s) 204 that is analogous to the corresponding layer in the MTJ 200. The seed layer 204 may, for example, be a crystalline MgO seed layer. The MgO seed layer 204 may enhance the perpendicular magnetic anisotropy of the free layer 210'.

Also shown in FIG. 6 are an optional Fe insertion layer 260 and an optional PEL 270. For example, the PEL 270 may be a CoFeB alloy layer, a FeB alloy layer, a Fe/CoFeB bilayer, a half metallic layer, or a Heusler alloy layer. Other high spin polarization materials may also be provided. In some embodiments, the PEL 270 may also be configured to enhance the perpendicular magnetic anisotropy of the pinned layer 230. In addition, the pinned layer 230' may be a SAF layer, including ferromagnetic layers 232 and 236 separated by a nonmagnetic layer 234. The ferromagnetic layers 232 and 236 may be antiferromagnetically coupled to each other through the nonmagnetic layer 234. In some embodiments, one or more of the ferromagnetic layers 232 may be a multilayer. The pinned layer 230' may be fabricated using step 106 of the method 100. Thus, portions of the MTJ 200" may be defined before formation of part of the pinned layer 230'. In other embodiments, the layers 232, 234, and 236 may be deposited before the edges of the MTJ 200" are defined.

The MTJ structure 200" shown in FIG. 6 may be formed using the method 110 of FIG. 5 to provide step 102 of the method 100 of FIG. 2. Referring to FIGS. 2, 5, and 6, the free layer 210 may include two or more portions, illustrated in FIG. 6 as being separated by a dashed line. The bottom portion of the free layer 210, under the dashed line, is deposited in step 112. Some portion of this layer may have been removed in step 118. The top portion of the free layer 210, above the dashed line, is deposited in step 120. Although, as shown in FIG. 6, the dashed line divides the free layer 210 substantially in half, embodiments of the inventive concepts are not limited thereto. Rather, different fractions of the free layer 210 may be formed during the steps 112 and 120. The free layer 210 may further be formed in more than two portions, and additional portions of the free layer 210 may be deposited in additional steps (not shown). Accordingly, although the free layer 210 may be considered to include a single ferromagnetic layer (for example, having a total thickness greater than about fifteen Angstroms), two or more portions of this ferromagnetic layer may be deposited in different steps of the method 110. In the embodiment shown in FIG. 6, the free layer 210 consists of such a single ferromagnetic layer formed through multiple deposits. In some embodiments, this ferromagnetic layer is a CoFeB layer including not more than about twenty atomic percent B.

When the free layer 210 is formed using an absorption/sacrificial insertion layer according to principles of the present inventive concepts, the free layer 210 may be formed thicker than conventional devices and still have a perpendicular-to-plane stable states for the magnetic moment 211, improved magnetoresistance, and/or less damping. The sacrificial layer addition and annealing processes of steps 116-118 may, for example, improve the crystallinity of the free layer 210 allowing for a higher magnetoresistance. And removal of the sacrificial layer in step 118 before deposition of the remaining portion of the free layer 210 may improve the damping of the free layer 210. Performing these processes in multiple stages can further improve these benefits. The free layer 210 may thus be fabricated having a larger thickness while still maintaining the desired crystal structure and perpendicular anisotropy.

For example, the free layer 210 may be formed to be thicker than about fifteen Angstroms, while still maintaining a perpendicular-to-plane magnetic moment 211. In some embodiments, the free layer 210 is not more than about twenty-five Angstroms thick. For example, the free layer 210 may be at least about sixteen Angstroms thick and not more than about twenty Angstroms thick. The thicker free layer 210 allows the MTJ structure 200" to have a higher magnetoresistance. And removal of the absorption/sacrificial layer may also reduce the damping in the free layer 210, allowing the free layer 210 to exhibit a lower switching current. And a smaller write current may also be used in programming the MTJ. Performance of the MTJ may thus be improved.

The pinned layer 230' may also improve performance of the MTJ 200" in a magnetic device. In particular, part of the MTJ including layers 210, 260, 220, 270, and some portion of the layer 230' may be defined first. The remainder of the pinned layer 230' may be defined later. Shadowing during these definition step(s) may be mitigated. Consequently, the manufacturing process may be improved and a more densely packed memory device achieved.

FIG. 7 is a flow chart illustrating a method 130 for fabricating a portion of a MTJ usable in a magnetic device such as a STT-RAM and, therefore, in a variety of electronic devices, according to another embodiment. These steps are not limited to those shown, however, and some steps may be omitted, performed in other orders, or combined. Further, the method 130 may start after other steps in forming a magnetic memory have already been performed. The method 130 may provide an embodiment of step 106 of the method 100 of FIG. 2. Thus, the method 130 may commence after the free layer and nonmagnetic spacer layer have been provided.

Referring to FIG. 7, a first portion of the pinned layer may be deposited, via step 132. This first portion of the pinned layer may be a single layer or a multilayer. For example, the first portion of the pinned layer may include a magnetic layer including Co, Fe, and/or B. For example, a CoFeB layer, having not more than about twenty atomic percent B, may be deposited. A PEL or other structure may also have been deposited between the pinned layer and the nonmagnetic spacer layer. A multilayer including ferromagnetic layers interleaved with nonmagnetic layers, such as a Co/Pt multilayer, might also be deposited. If the pinned layer being formed in the method 130 is a SAF, step 132 may include depositing a portion of the magnetic (multi)layer; the magnet (multi)layer and some or all of the nonmagnetic layer; or the magnetic (multi)layer, the nonmagnetic layer and a portion of the top magnetic (multi)layer. In general, however, a smaller portion of the pinned layer is deposited in step 132. This allows for a thinner structure to be defined in step 138, below.

An absorption/sacrificial insertion layer may be deposited on the portion of the pinned layer that has been formed, via step 134. The absorption layer may include one or more materials that have an affinity for boron, that have a low diffusion, and that are a relatively good lattice match for the underlying layer. For example, the difference in lattice parameters between the underlying ferromagnetic layer and the absorption/sacrificial insertion layer may be less than about ten percent. For example, the insertion layer may include one or more of Bi, W, I, Zn, Nb, Ag, Cd, Hf, Os, Mo, Ca, Hg, Sc, Y, Sr, Mg, Ti, Ba, K, Na, Rb, Pb, and Zr. In some embodiments, the insertion layer consists of Bi, W, I, Zn, Nb, Ag, Cd, Hf, Os, Mo, Ca, Hg, Sc, Y, Sr, Mg, Ti, Ba, K, Na, Rb, Pb, and/or Zr. The insertion layer may be thin. The absorption/sacrificial insertion layer is, however, desired to be continuous to allow for patterning, as discussed below.

The absorption/sacrificial insertion layer and underlying layer(s) are then annealed, via step 136. For example, an RTA at a temperature(s) in the range of approximately between about 300-400° C. may be used. In other embodiments, the annealing process may be performed in another manner or at another temperature. Thus, not only the portion of the pinned layer deposited in step 132 and the absorption/sacrificial insertion layer are annealed in step 136, but also the nonmagnetic spacer layer and free layer which may reside below the insertion layer. Thus, the temperature and other characteristics of the annealing process may be selected such that the nonmagnetic spacer layer, such as a crystalline MgO tunneling barrier layer, is not adversely affected.

After the annealing process, the portion of the MTJ under the insertion layer may be photolithographically defined, via step 138. Step 138 may thus include providing a photoresist layer and patterning the photoresist layer to provide a photoresist mask. Other materials may also be used for the mask. The mask covers the portions of the deposited layers that are to form part of the MTJ. The regions around the MTJ are exposed. The edges of the MTJ may be defined using an ion mill process or other mechanism for etching the exposed portions of the layers. The ion mill process may be carried out at a small angle with respect to normal to the top of the sacrificial layer.

A refill step may then be performed, via step 140. Thus, a nonmagnetic insulating layer such as alumina may be deposited. A planarization process might also be performed in order to provide a flat surface for subsequent processing.

The sacrificial layer may then be removed, via step 142. Step 142 may be performed, for example, via plasma etching. Other removal methods may also be used. In the removal step, some portion of the underlying part of the pinned layer may be removed. As explained previously, multiple absorption layer deposition, annealing, and removal steps may be performed (see FIG. 27) to increase the benefits obtained by use of a sacrificial absorption layer.

A remainder of the pinned layer, if any, may then be deposited, via step 144. For example, additional ferromagnetic layer(s) may be deposited directly on the exposed first ferromagnetic layer. In embodiments in which the pinned layer is a SAF, the additional layers deposited may depend upon the fraction of the pinned layer deposited in step 132. For example, if the entire bottom ferromagnetic layer (or multilayer) was deposited in step 132, then the nonmagnetic layer such as Ru and another magnetic layer may be deposited in step 144. In other embodiments, the pinned layer may be formed in another manner.

The remaining portion of the MTJ may be defined, via step 146. Step 146 may be carried out photolithographically, in a manner analogous to step 138. However, because the free layer has already been defined in step 138, a lower density pattern may be used in step 146. Thus, the top of the MTJ may be narrower than the bottom. In other embodiments, the upper portion of the MTJ may be the same size as or wider than the lower portion of the MTJ. In some embodiments, the top portions of the pinned layers might extend over multiple MTJ structures.

Figure 8:
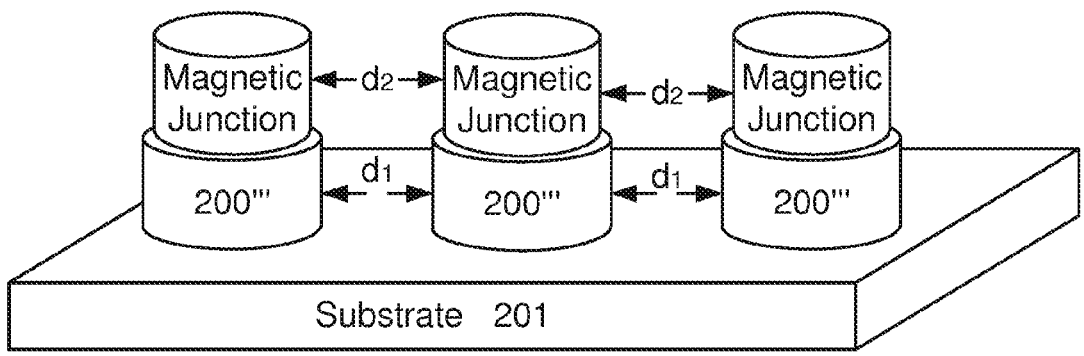
FIG. 8 is a schematic block diagram depicting an exemplary embodiment of MTJ structures usable in a magnetic memory and programmable using spin transfer torque.

FIG. 8 is a somewhat schematic illustration of an exemplary embodiment of a multiple MTJ structure including MTJs 200''' that may be fabricated using the method 130. The sizes and shapes of features shown in FIG. 8 are not to scale. The MTJs 200''' may be used in a magnetic device such as a STT-RAM and, therefore, in a variety of electronic devices. The MTJs 200''' may be analogous to the MTJs 200, 200' and/or 200'' of the previous embodiments. However, for simplicity the individual layers of the MTJs 200''' are not shown.

As can be seen in FIG. 8, lower portions of the MTJs 200''' defined in step 138 may be spaced apart from each other by a first distance, $d_1$. Upper portions of the MTJs 200''', defined in step 146, may be separated from each other by a second distance $d_2$. The first distance may be less than the second distance (i.e., $d_1<d_2$). Thus, the photoresist masks used for steps 138 and 146 may have a different density. In other embodiments, however, the density could be the same such that the first and second distances are approximately equal (i.e., $d_1=d_2$). In still other embodiments, the density of the mask used in step 146 may be greater than that of the mask used in step 138. Thus, the first distance may be greater than the second distance (i.e., $d_1>d_2$) in such an embodiment. In still other embodiments, the top portions of the MTJs 200''' might be connected. Further, the aspect ratios, footprints and other geometric parameters of the tops and bottoms of the MTJs 200''' may be different. Although only three MTJs are shown, any other number may be fabricated together. In addition, a two- or three-dimensional array of magnetic junctions may be manufactured together on a substrate. However, for clarity, only a line of three is shown in FIG. 8.

Referring to FIGS. 6-8, using the method 130, fabrication processes and performance of the MTJs 200''' may be improved. For example, lower portions of the MTJs 200''' may be defined first. A remainder of the pinned layer 230' may be defined later. The portions of the stacks being defined in steps 138 and 146 may be thinner. As a result, the adverse effects of shadowing during these definition steps may be mitigated. Thus, the bottom portions of the MTJs 200''' may be more closely packed and better defined. The upper portions of the MTJs 200''' do not include the free layer. The spacing between these portions of the MTJs 200''' is therefore less critical. These portions may be spaced further apart. Thus, better process control and integration may be achieved. Further, separately configuring these sections of the MTJs 200''' may allow for tailoring the geometry for improved performance. Consequently, the manufacturing processes may be improved and a more densely packed memory device achieved. If the free layers of the MTJs 200''' are fabricated using the method 110 of FIG. 5, performance may be further improved.

Figure 9:
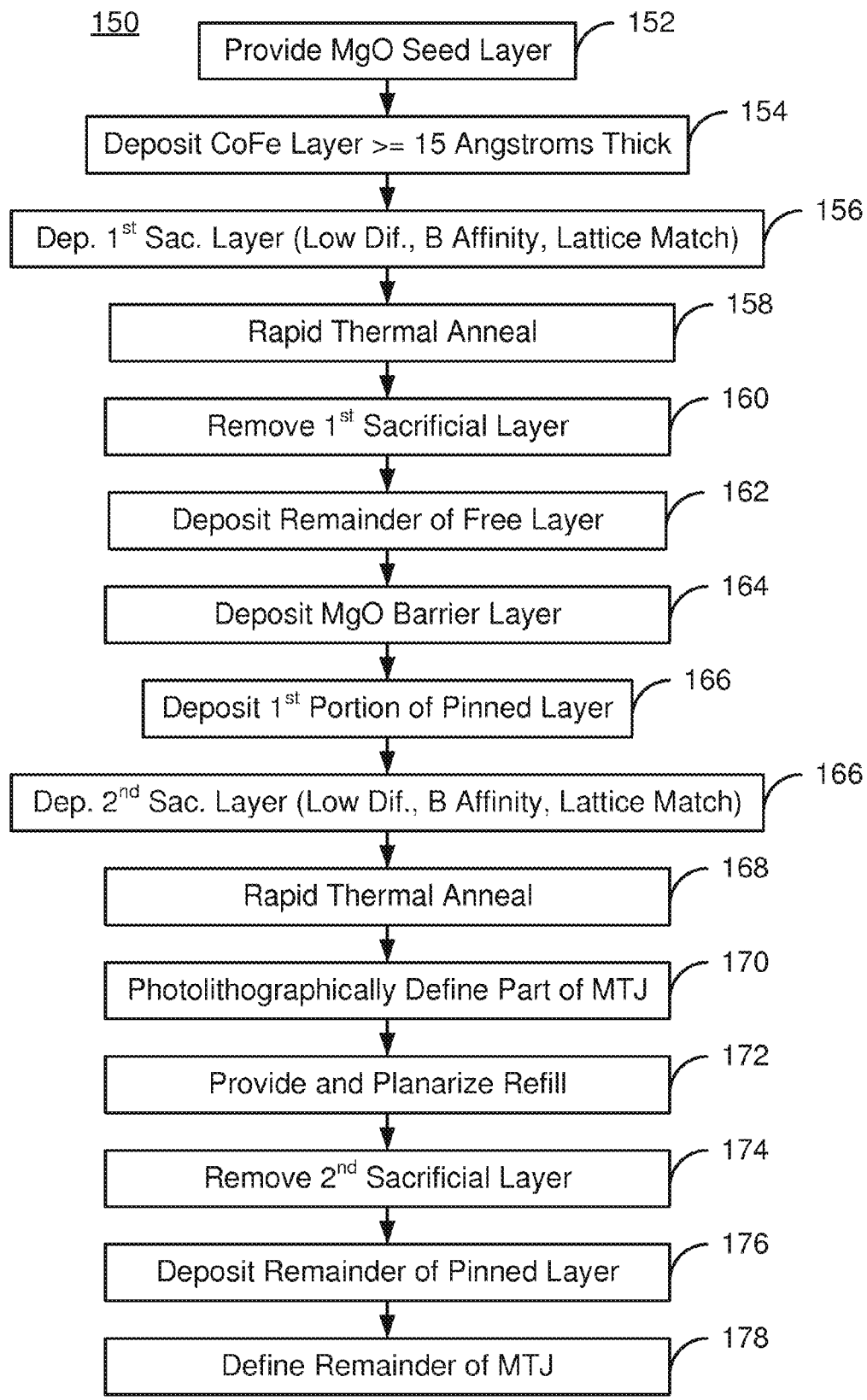
FIG. 9 is a flow chart showing another exemplary embodiment of a method for providing a MTJ structure usable in a magnetic memory and programmable using spin transfer torque.

FIG. 9 is a flow chart illustrating an exemplary embodiment of a method 150 for fabricating a MTJ usable in a magnetic device such as a STT-RAM and, therefore, in a variety of electronic devices. Although illustrated with respect to specific steps performed in a specific order, some of these steps may be omitted, performed in another order, or combined together. Further, the method 150 may start after other steps in forming a magnetic memory have already been performed. FIGS. 10-24 depict embodiments of a MTJ during fabrication using the method 150 of FIG. 9. The features and elements of FIGS. 10-24 are not shown to scale.

Referring to FIGS. 9-24, a crystalline MgO seed layer may be deposited, via step 152. In some embodiments, step 152 forms one nonmagnetic spacer layer as a dual MTJ. Thus, a pinned layer would reside below the crystalline MgO layer. In other embodiments, the layer deposited in step 152 may be a seed layer for a bottom magnetic tunnel junction layer.

A first CoFeB layer of the free layer is deposited, via step 154. This layer may be analogous to those described above with respect to steps 102 and 112 of FIGS. 2 and 5, respectively. In some embodiments, the ferromagnetic layer may be at least about fifteen Angstroms thick. However, in other embodiments, other thicknesses and/or other layers are possible. FIG. 10 depicts the MTJ 300 after step 154 is performed. Thus, the MgO seed layer 302 and first ferromagnetic layer 312 of the free layer are shown.

An absorption/sacrificial insertion layer may be deposited on the first ferromagnetic layer 302, via step 156. Step 156 is thus analogous to step 114 of FIG. 5. The materials and thicknesses of the sacrificial insertion layer may therefore be the same as those described above. FIG. 11 depicts the MTJ 300 after step 156 is performed. Thus, the sacrificial insertion layer 304 is shown. In some embodiments, the materials and thicknesses of the sacrificial insertion layer 304 may be analogous to those described above for the methods 100 and 110 of FIGS. 2 and 5, respectively.

The layers 302, 304, and 312 may then be annealed, via step 158. For example, an RTA at temperature(s) in the range of approximately between about 300-400° C. may be used. The annealing process of step 158 may be analogous to that of step 116 of FIG. 5. After the annealing process, the sacrificial layer 304 may be removed, via step 160. Step 160 may be analogous to step 118 of FIG. 5. For example, a plasma etch process may be used.

FIG. 12 depicts the MTJ 300 after step 160 is performed. Thus, the sacrificial insertion layer 304 has been removed. Some portion of the first ferromagnetic layer 312' may also have been removed. A slightly thinner ferromagnetic layer 312' is thus shown.

In some embodiments, a remainder of the free layer may then be deposited, via step 162. For example, a second CoFeB ferromagnetic layer may be deposited on the exposed first ferromagnetic layer 312'. FIG. 13 depicts the MTJ 300 after step 162. Thus, the second ferromagnetic layer 314 has been deposited. The layers 312' and 314 together form the free layer 310.

A nonmagnetic spacer layer may be provided, via step 164. In some embodiments, a crystalline MgO barrier layer may be provided in step 164. FIG. 14 depicts the MTJ 300 after step 164 is performed. Thus, the nonmagnetic spacer layer 320 has been fabricated.

Figure 15:
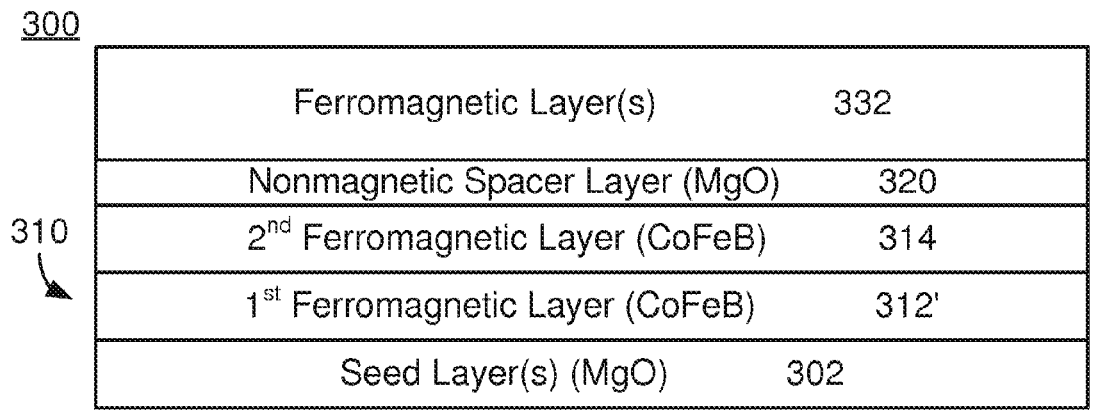

A first portion of the pinned layer may be deposited, via step 166. Step 166 may be analogous to step 132 of FIG. 7. Thus, a single layer or a multilayer including ferromagnetic layers and/or nonmagnetic layers may be deposited. FIG. 15 depicts the MTJ 300 after step 166. Thus, ferromagnetic layer(s) 332 are shown. In the embodiment depicted in FIGS. 15-24, the entire lower layer/multilayer of a SAF pinned layer is provided in step 166. However, in other embodiments, more or fewer layers of the magnetic layer 332 may be deposited in step 166.

Figure 16:
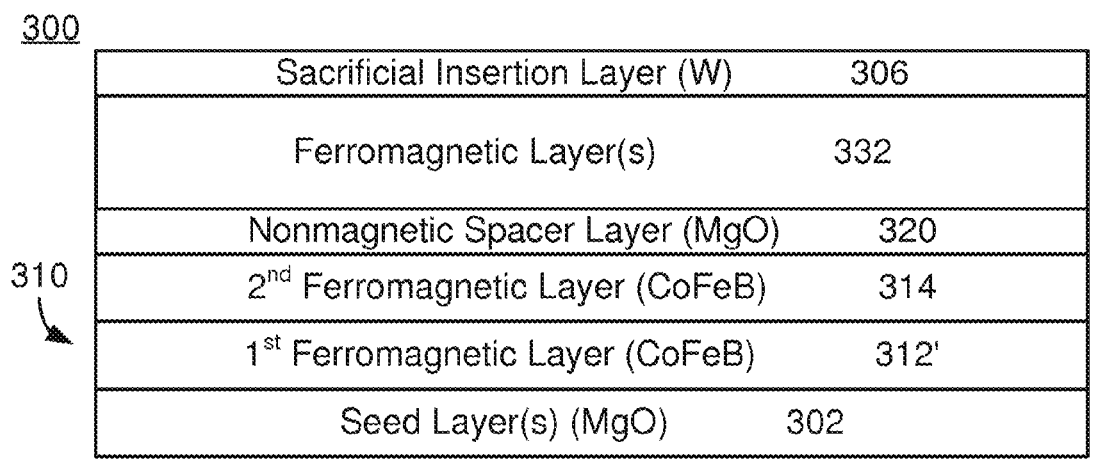

An additional sacrificial insertion layer is deposited on the ferromagnetic layer 332, via step 166. Step 166 may be analogous to step 134 of FIG. 7. Thus, the material(s) and thicknesses described above with reference to FIG. 7 may be used. FIG. 16 depicts the MTJ 300 after step 168 is performed. Thus, the sacrificial insertion layer 306 is shown.

The layers 302, 312', 314, 320, and 306 may be annealed, via step 168. Step 168 may be analogous to step 136 of FIG. 7. For example, an RTA at temperature(s) as described above with respect to FIG. 7 may be performed. The temperature and other characteristics of the annealing process may be selected such that the nonmagnetic spacer layer, such as a crystalline MgO tunneling barrier layer, is not adversely affected.

Figure 17:
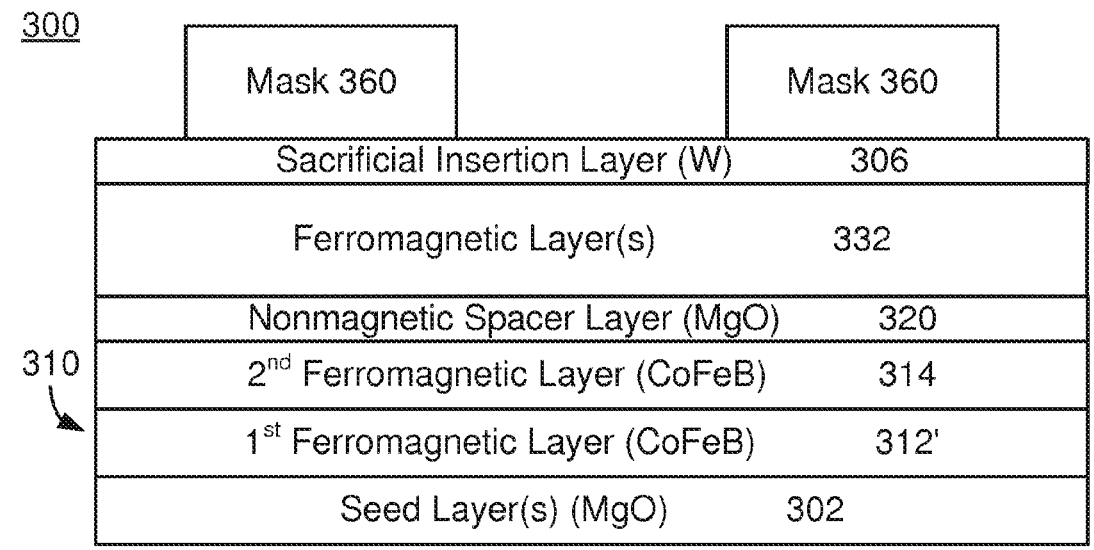
Figure 18:
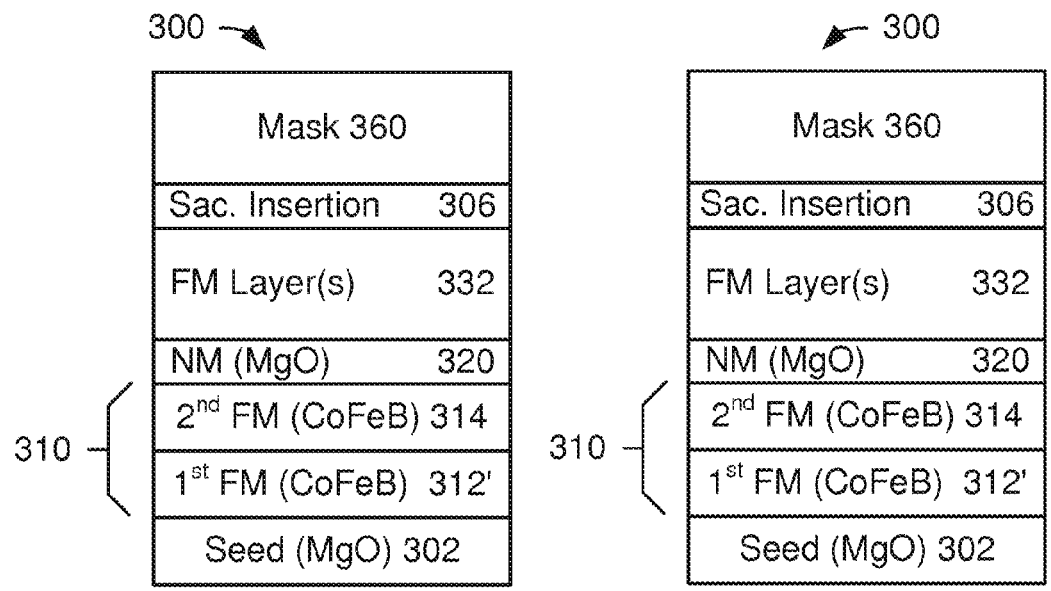

After the annealing process, the portion of the MTJ 300 under the sacrificial layer may be photolithographically defined, via step 170. Step 170 may be analogous to step 138 of FIG. 7. FIG. 17 depicts the MTJ during step 170. Thus, a mask 360 has been provided on the sacrificial insertion layer 306. FIG. 18 depicts the MTJ after step 170. Thus, portions of two MTJs 300 have been defined. In particular, the free layer 310, nonmagnetic layer 320, and ferromagnetic layer 332 have been defined.

Figure 19:
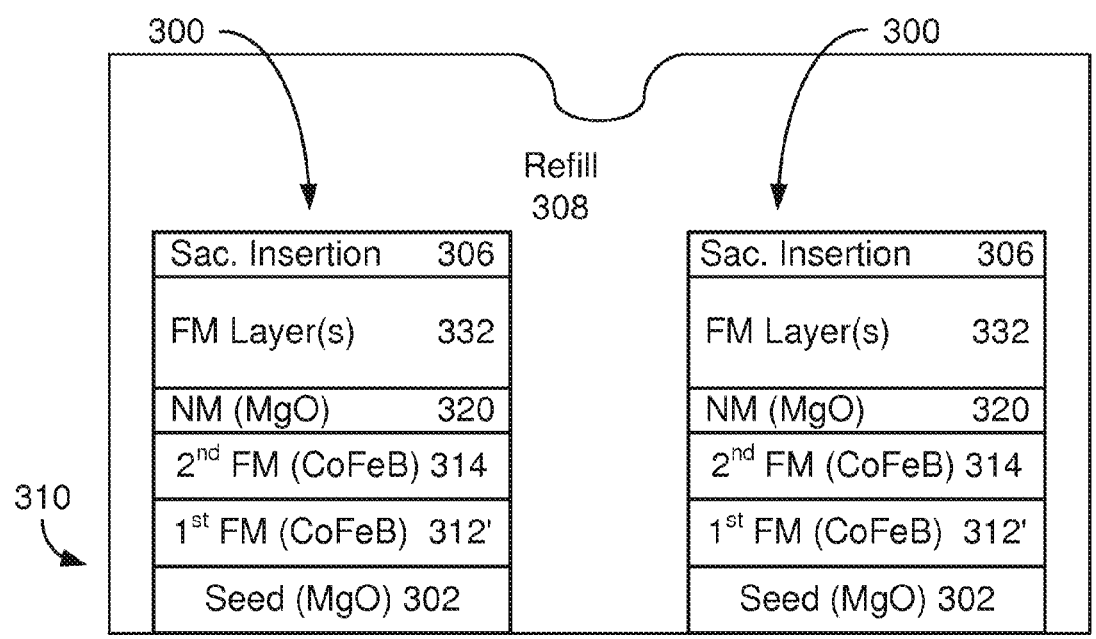
Figure 20:
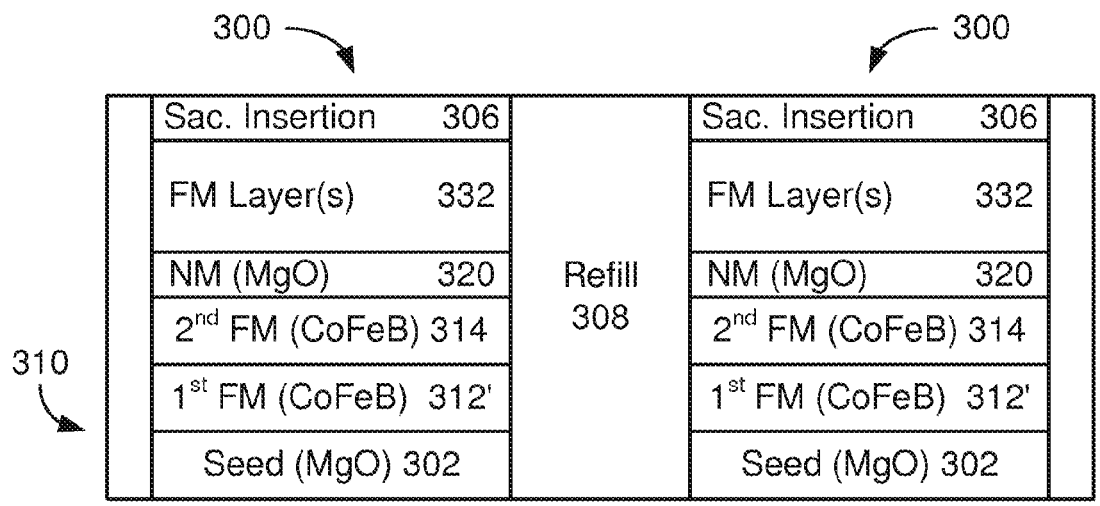

A refill step is then performed, via step 172. Thus, a nonmagnetic insulating layer such as alumina may be deposited and planarized. Step 172 may be analogous to step 140 of FIG. 7. FIGS. 19-20 depict the MTJ during and after step 172. Thus, the refill material 308 is depicted in FIG. 19. FIG. 20 depicts the MTJs 300 after step 172 is completed. Thus, the top surface of the refill 308 has been planarized.

Figure 21:
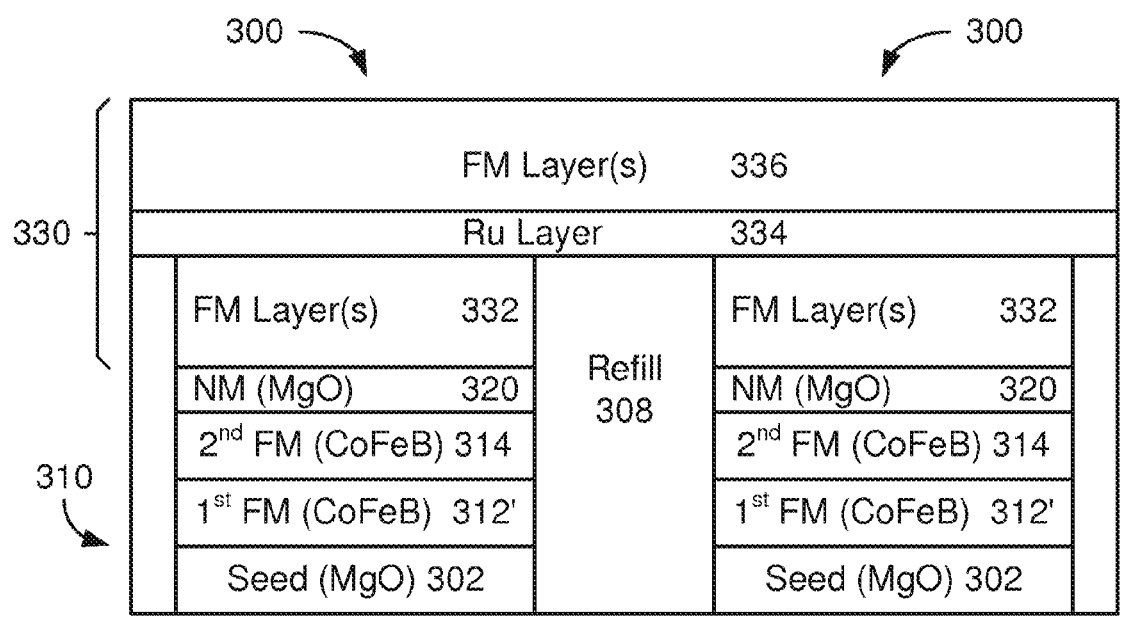

The sacrificial layer may then be removed, via step 174. Step 174 may be analogous to step 142 of FIG. 7. The remainder of the pinned layer, if any, may then be deposited, via step 176. Step 176 may be analogous to step 144 of FIG. 7. FIG. 21 depicts one embodiment of the MTJ 300 after step 174 is completed. In the embodiment shown, the entire bottom ferromagnetic layer (or multilayer) 332 was deposited in step 166. Thus, a nonmagnetic layer such as Ru layer 334 and ferromagnetic layer(s) 336 may be deposited in step 174 and are shown in FIG. 21. Note that the layers 334 and 336 may extend across two MTJs 300. The layers 332, 334, and 336 form a SAF pinned layer.

Figure 22:
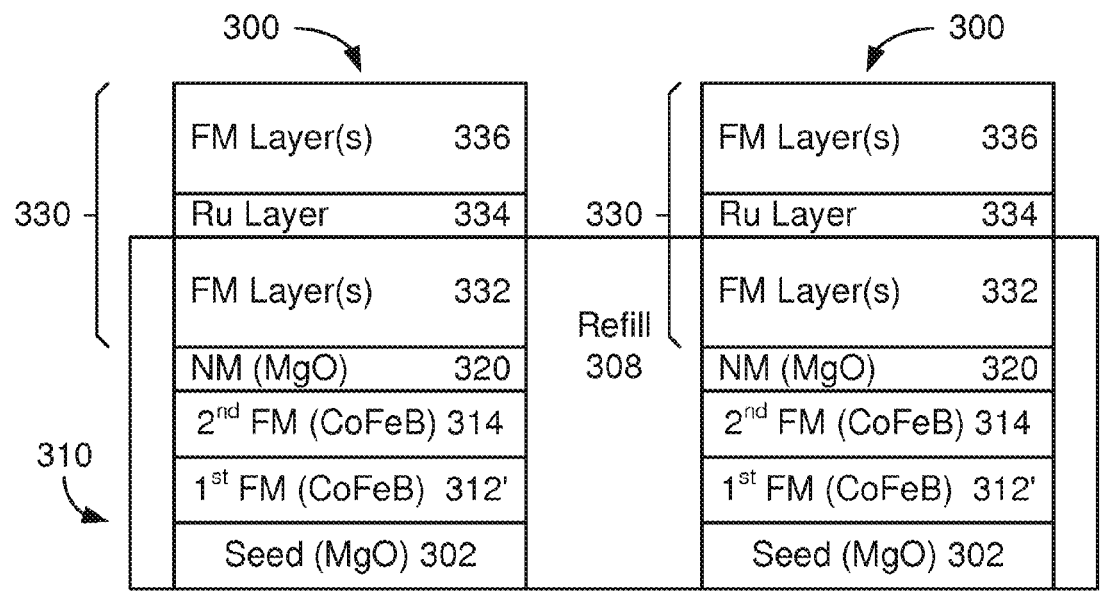

The remaining portion of the MTJ may be defined, via step 178. Step 178 may be analogous to step 146 of FIG. 7. Step 178 may be carried out photolithographically, in a manner analogous to step 170. However, because the free layer has already been defined in step 170, a different density pattern may be used in step 178. Thus, the top of the MTJ may be narrower, the same size as, or wider than the bottom. In some embodiments, the top portions of the pinned layers might extend over multiple MTJ structures. FIG. 22 depicts an embodiment of the MTJ 300 after step 178 is carried out. Thus, the pinned layers 330 have been defined. In the embodiment shown, the top of the pinned layer 330 is the same size as the bottom.

Figure 23:
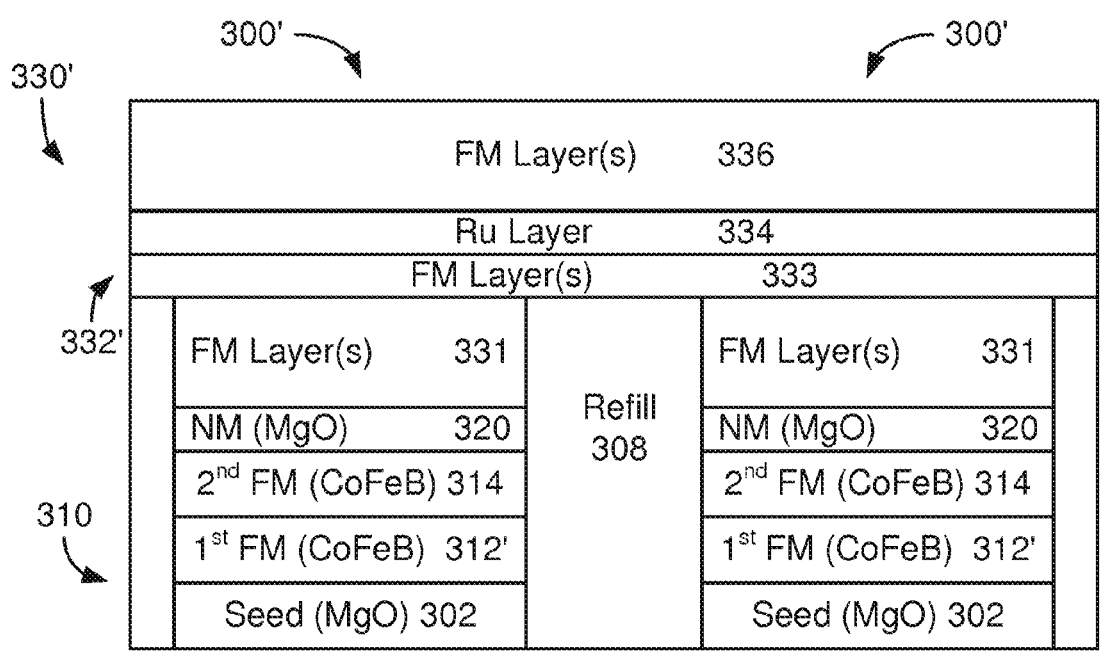
FIGS. 23-24 are schematic block diagrams depicting another exemplary embodiment of a MTJ structure usable in a magnetic memory and programmable using spin transfer torque at various stages during fabrication.
Figure 24:
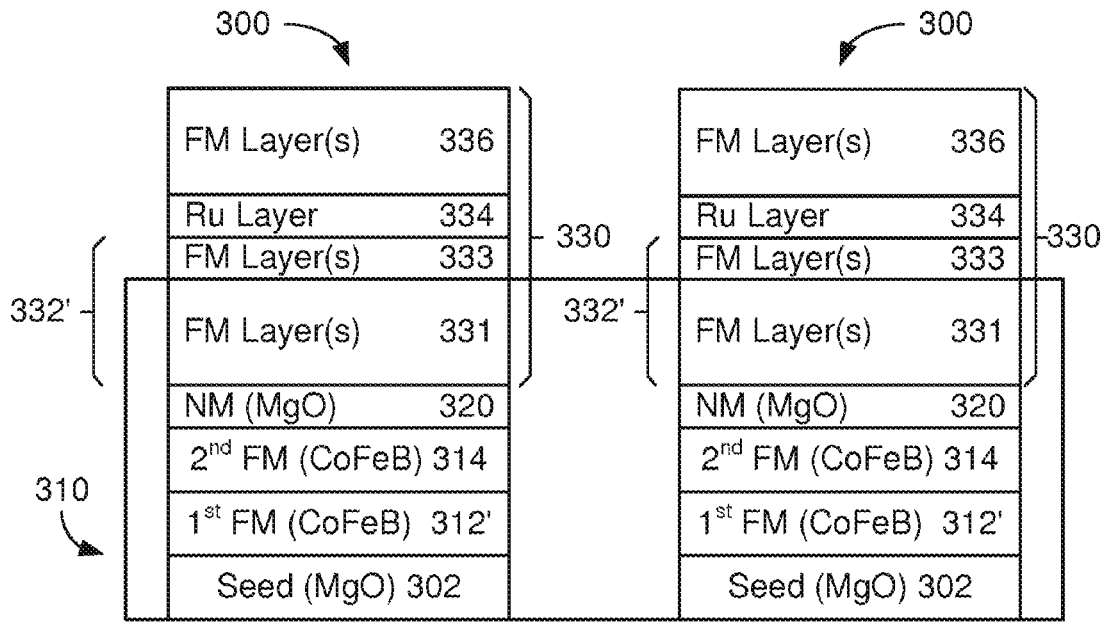

FIGS. 23-24 depict an embodiment of the MTJ 300' in which a portion, but not all, of the layer 332 is deposited in step 166. FIG. 23 depicts such an embodiment after step 176 has been performed. Thus, layers 333, 334, and 336 are shown. Layers 333 and 331 together form the bottom ferromagnetic layer 332' of the SAF pinned layer 330'. FIG. 24 depicts the MTJ after step 178 has been performed. Thus, the top portion of the MTJs 300' have been defined.

The MTJs 300 and 300' may share the benefits of the MTJs 200, 200', 200'', and/or 200'''. Thus, the MTJs 300 and 300' may have improved magnetoresistance, reduced damping and switching current, and/or may be packed more densely in a magnetic device.

Figure 25:
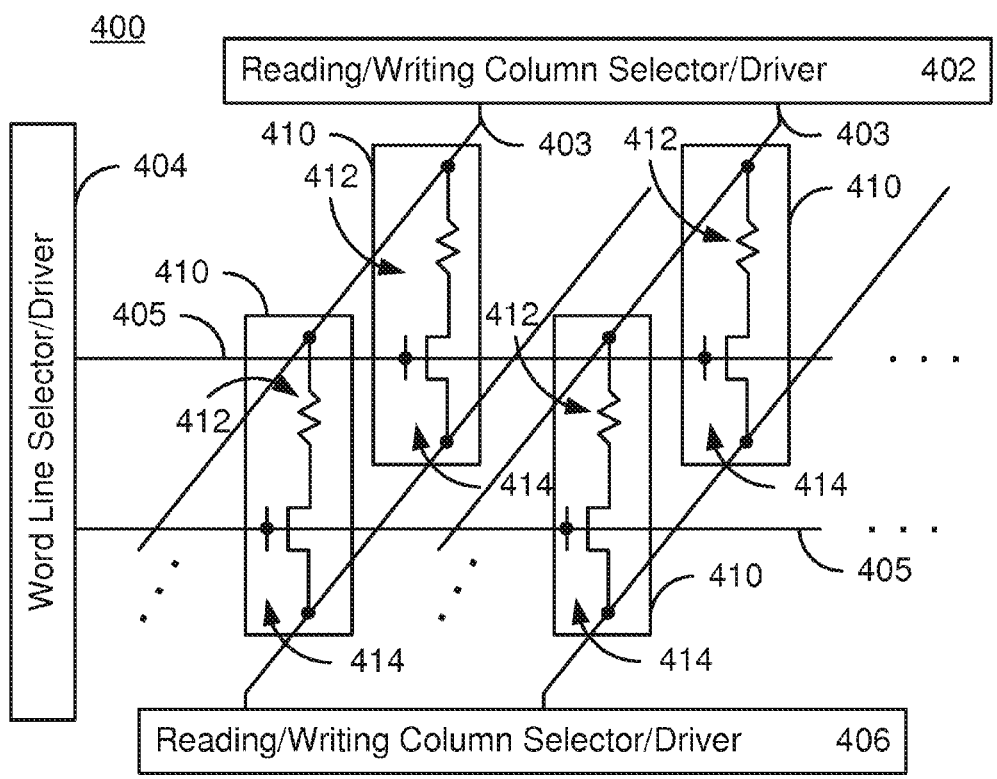
FIG. 25 is a schematic circuit diagram illustrating an exemplary embodiment of a memory utilizing MTJ structures in the memory element(s) of the storage cell(s).

FIG. 25 depicts an exemplary embodiment of a memory 400 that may use one or more of the MTJs 200, 200', 200'', 200''', 300, and/or 300' of the previously described embodiments. The magnetic memory 400 may include reading/writing column select drivers 402 and 406 as well as a word line select driver 404. Other and/or different components may be provided. The storage region of the memory 400 may include magnetic storage cells 410. Each magnetic storage cell may include at least one MTJ 412 and at least one selection device 414. In some embodiments, the selection device 414 is a transistor. The MTJ 412 may be one of the MTJs 200, 200', 200'', 200''', 300 and/or 300' disclosed herein. Although one MTJ 412 is shown per cell 410, in other embodiments, another number of MTJs 412 may be provided per cell. By implementing MTJs constructed according to principles of the present inventive concepts, the magnetic memory 400 may enjoy the benefits described herein.

Figure 26:
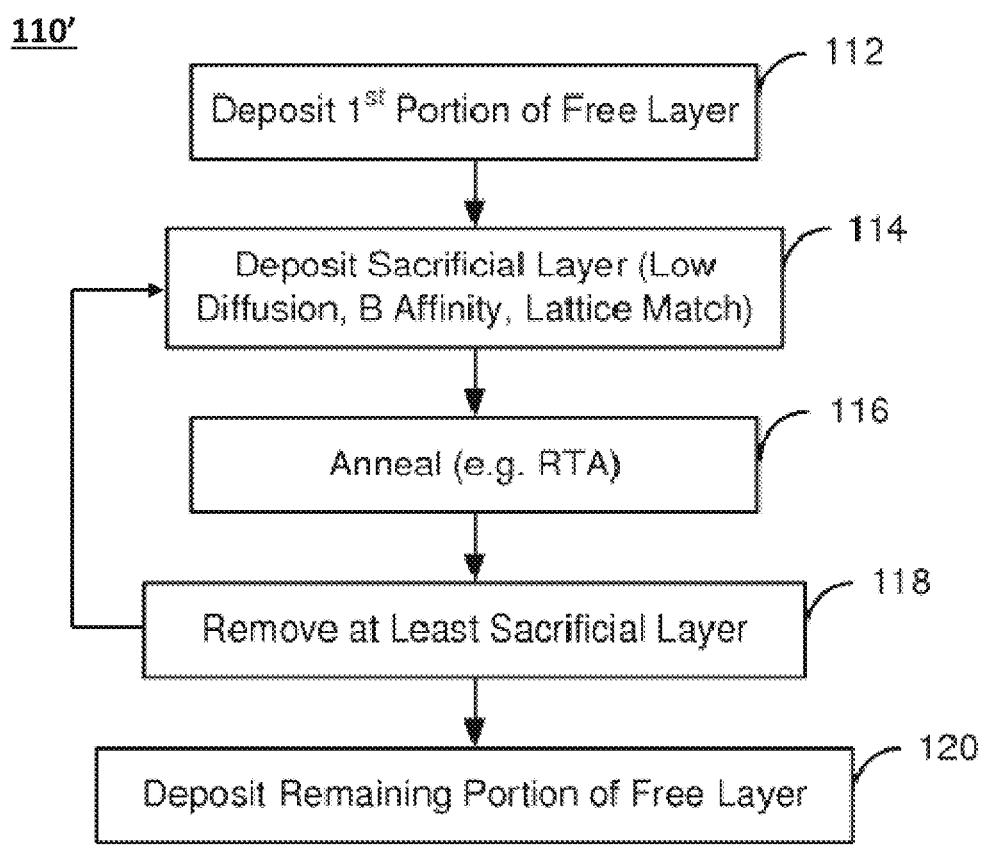
FIG. 26 is a flow chart illustrating a method of fabricating a MTJ structure according to an alternative embodiment in which a multi-stage element removal process is used to reduce an element concentration level in a desired layer (i.e., a free layer) of the MTJ structure by repeatedly applying and removing absorption layers.

FIGS. 26-29 illustrate methods and systems for fabricating MTJ structures according to additional principles and embodiments of the present inventive concepts. In particular, FIG. 26 is a flow chart illustrating a method 110' of fabricating a MTJ structure according to an alternative embodiment in which a multi-stage element removal process may be used to reduce an element concentration level in a free layer of the MTJ structure by repeatedly applying, annealing, and removing absorption layers. The method 110' illustrated in FIG. 26 may be similar to the method 110 shown in FIG. 5, except that steps 114, 116, and 118 of depositing, annealing, and removing the sacrificial layer may be performed multiple times in stages or cycles with similar or different processing parameters to increase the benefits obtained.

Figure 27:
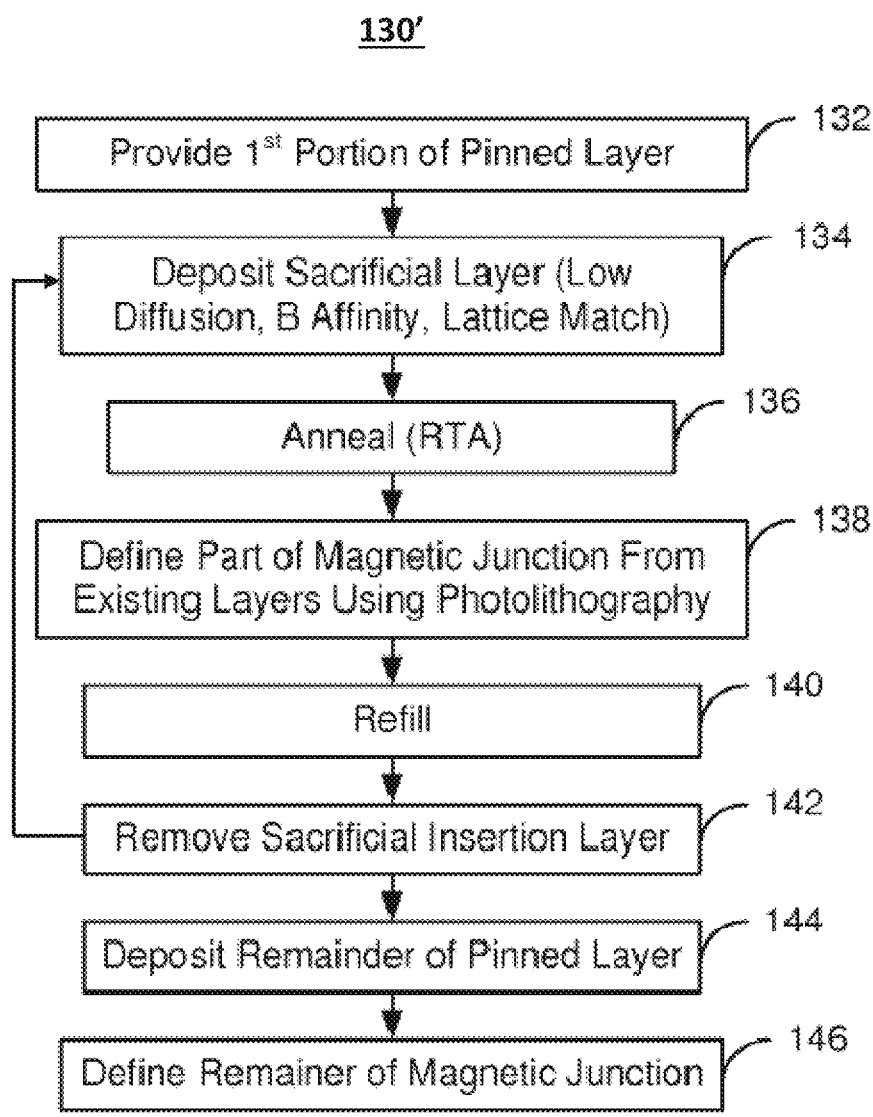
FIG. 27 is a flow chart illustrating a method of fabricating a MTJ structure according to a still further alternative embodiment in which a multi-stage element removal process is used to reduce an element concentration level in a desired layer (i.e., a pinned layer) of the MTJ structure by repeatedly applying and removing absorption layers.

FIG. 27 is a flow chart illustrating a method 130' of fabricating a MTJ structure according to a still further alternative embodiment in which a multi-stage element removal process may be used to reduce an element concentration level in a pinned layer of the MTJ structure by repeatedly applying, annealing, and removing absorption layers. The method 130' of FIG. 27 may be similar to the method 130 of FIG. 7, except that the steps 134, 136, and 142 may be performed multiple times in stages, for example, before steps 138 and 140, with the same or different processing parameters, to increase the benefits obtained.

Figure 28:
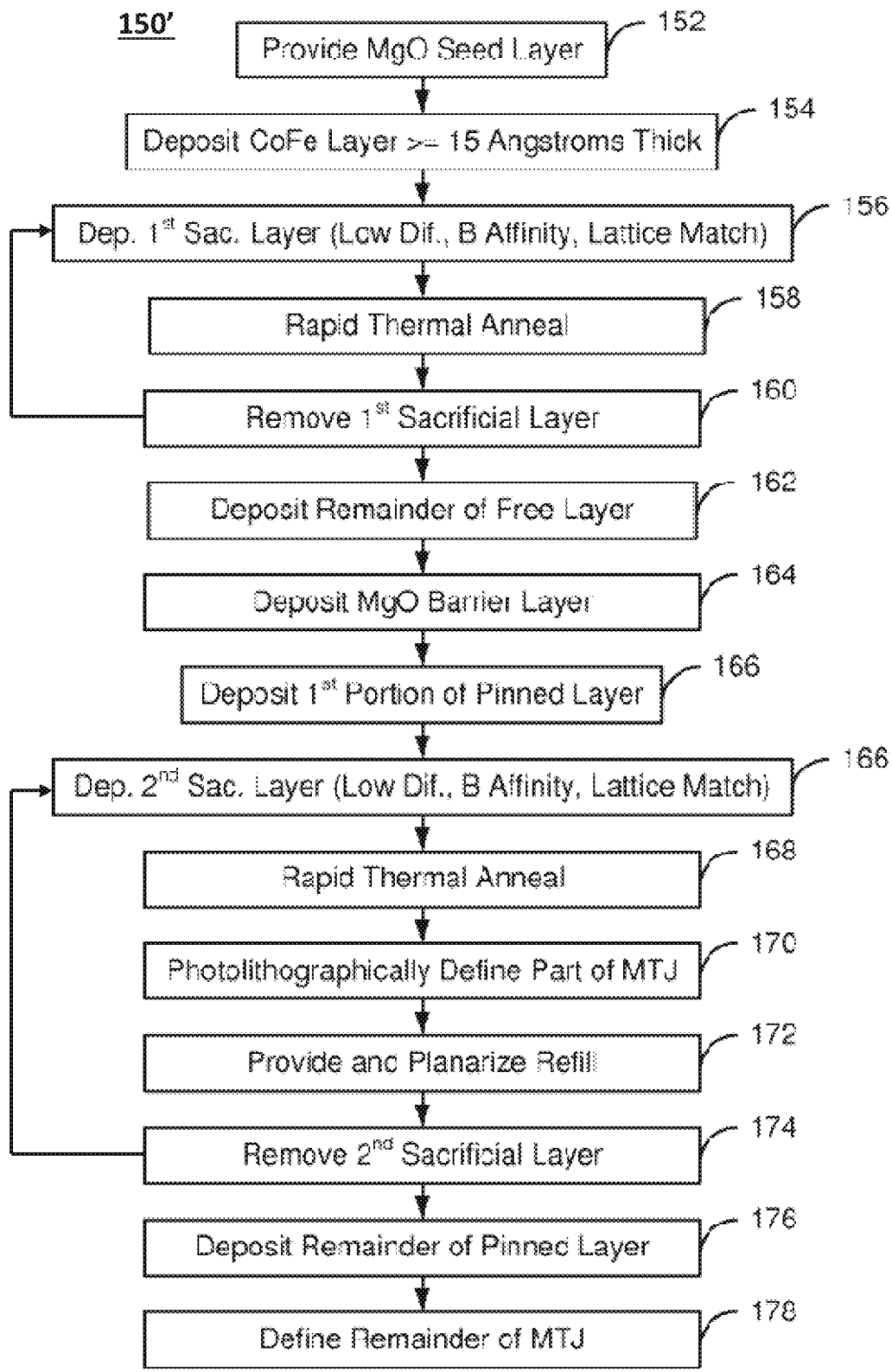
FIG. 28 is a flow chart illustrating a method of fabricating a MTJ structure according to a still further alternative embodiment in which a multi-stage element removal process is used to reduce an element concentration level in desired layers (i.e., both free and pinned layers) of the MTJ structure by repeatedly applying and removing absorption layers.

FIG. 28 is a flow chart illustrating a method 150' of fabricating a MTJ structure according to a still further alternative embodiment in which a multi-stage element removal process may be used to reduce an element concentration level in both free and pinned layers of the MTJ structure by repeatedly applying, annealing, and removing absorption layers. The method 150' of FIG. 28 may be similar to the method 150 of FIG. 9, except that the steps 156, 158, and 160 and the steps 166, 168, and 174 may be performed multiple times in stages, for example, before steps 170 and 172, with the same or different processing parameters to increase the benefits obtained.

FIG. 29 is a schematic block diagram and graphical illustration of a multi-stage element removal process along with an element concentration level in a layer of the MTJ structure and absorption layer at various stages of a multi-stage element removal process. Referring to FIG. 29, a multi-stage element removal process may be performed on a MTJ layer 510 such as a free layer or a pinned layer to reduce an element concentration level 515 of the layer 510.

In a first stage (Cycle 1), a first absorption/sacrificial layer 520(1) is deposited on the MTJ layer 510. The MTJ layer has an element concentration level 515 indicated by a dashed line. The MTJ structure is then annealed at a first temperature T1 to anneal the structure and move the desired element from the MTJ layer 510 to the absorption layer 520(1). As indicated by the dashed line, a portion of the element previously contained in the MTJ layer 510 may be moved to the sacrificial layer 520(1) through the annealing process. The sacrificial absorption layer 520(1) may then be partially or completely removed. The result of the first stage is therefore a MTJ layer 520(1) having a reduced element concentration level 515.

This process can then be repeated in multiple stages (i.e., cycles). In each stage, a sacrificial absorption layer 520(N) can be deposited with a desired thickness tN on the MTJ structure resulting from the previous stage, and the combined structure can then be annealed at a desired temperature TN to move a portion of the desired element(s) from the MTJ layer 510 to the sacrificial layer 520(N). The sacrificial layer 520(N) can then be partially or completely removed to leave the MTJ layer 510 with a reduced element concentration level 515. After the final stage has been performed, the MTJ layer 510 can be provided having the desired element concentration level 515(N).

By applying the absorption layer deposition, heat treatment, and removal cycle several times, deeper element removal for a given absorption layer material can be obtained, along with a decreased risk of damage to the underlying MTJ structure. More specifically, the required annealing temperature and milling power can be decreased through a multi-stage removal process, and additional freedom can be provided for optimization and tailoring of the process parameters and conditions by permitting variation in the conditions from cycle to cycle (or stage to stage). And the process cycle may be repeated any selected number of times until the desired level of element concentration is achieved.

Various methods and systems for providing a MTJ and a memory fabricated using the MTJ have been described herein. The methods and systems have been described in accordance with various exemplary embodiments, and one of ordinary skill in the art will readily recognize numerous variations that can be made to the embodiments, and any such variations would be within the spirit and scope of the present inventive concepts. Accordingly, all such modifications should be considered within the spirit and scope of the appended claims.

We claim:

1. A method for providing a MTJ on a substrate, the method comprising:
    providing a free layer that is switchable between a plurality of stable magnetic states; wherein providing the free layer includes:
        depositing at least a first portion of the free layer;
        depositing a first sacrificial layer on the free layer;
        annealing at least the free layer and the first sacrificial layer at a first temperature to move an element from the free layer to the first sacrificial layer;
        removing at least a portion of the first sacrificial layer;
        depositing a second sacrificial layer on the free layer;
        annealing at least the free layer and the second sacrificial layer at a second temperature that is different from the first temperature to move the element from the free layer to the second sacrificial layer; and
        removing at least a portion of the second sacrificial layer.

2. The method of claim 1, further comprising:
    providing a nonmagnetic spacer layer; and
    providing a pinned layer, wherein the nonmagnetic spacer layer is arranged between the pinned layer and the free layer, and wherein providing the pinned layer includes:
        depositing at least a first portion of the pinned layer;
        depositing a first sacrificial layer on the pinned layer;
        annealing at least the pinned layer and the first sacrificial layer at a first temperature to move an element from the pinned layer to the first sacrificial layer;
        removing at least some of the first sacrificial layer from the pinned layer;
        depositing a second sacrificial layer on the pinned layer;
        annealing at least the pinned layer and the second sacrificial layer at a second temperature that is different from the first temperature to move an element from the pinned layer to the second sacrificial layer; and
        removing at least some of the second sacrificial layer from the pinned layer.

3. The method of claim 1, further comprising depositing a second portion of the free layer after one or more of the removing steps have been performed.

4. The method of claim 2, further comprising depositing a second portion of the pinned layer after one or more of the removing steps have been performed.

5. The method of claim 1 wherein the first sacrificial layer is deposited having a first thickness and the second sacrificial layer is deposited having a second thickness.

6. The method of claim 5, wherein the first thickness is greater than the second thickness.

7. The method of claim 5, wherein the first thickness is less than the second thickness.

8. The method of claim 5, wherein the first thickness is approximately the same as the second thickness.

9. The method of claim 1, wherein the first temperature is higher than the second temperature.

10. The method of claim 1, wherein the first temperature is lower than the second temperature.

11. The method of claim 2 wherein the step of providing the pinned layer further includes depositing at least one refill material before the step of removing the second sacrificial layer.

12. The method of claim 11 further comprising performing a planarization process after the step of depositing the at least one refill material.

13. The method of claim 11 further comprising defining a portion of the MTJ before removing second sacrificial layer from the pinned layer, the step of defining a portion of the MTJ comprising:
    providing a photoresist mask on the second sacrificial layer, the photoresist mask covering a portion of the second sacrificial layer corresponding to the MTJ; and
    removing an exposed portion of the second sacrificial layer, the first portion of the pinned layer, the nonmagnetic spacer layer, and the free layer exposed by the photoresist mask.

14. A method for providing a MTJ on a substrate, the method comprising:
    providing a free layer that is switchable between a plurality of stable magnetic states;
    wherein providing the free layer includes:
        depositing at least a first portion of the free layer;
        depositing a sacrificial layer on the free layer;
        annealing at least the free layer and the sacrificial layer to move an element from the free layer to the sacrificial layer;
        removing at least a portion of the sacrificial layer; and
        repeating the steps of depositing, annealing, and removing at least one additional time, wherein one or more process conditions are independently selected for the initial and each of the subsequent depositing, annealing, and removing steps and varied between the initial and subsequent steps to improve an element removal process and reduce the risk of damage to the underlying MTJ.

15. The method of claim 14, further comprising:
providing a nonmagnetic spacer layer; and
providing a pinned layer, wherein the nonmagnetic spacer layer is arranged between the pinned layer and the free layer, and wherein providing the pinned layer includes:
depositing at least a first portion of the pinned layer;
depositing a sacrificial layer on the pinned layer;
annealing at least the pinned layer and the sacrificial layer to move an element from the pinned layer to the sacrificial layer;
removing the sacrificial layer from the pinned layer; and
repeating the steps of depositing, annealing, and removing at least one additional time.

16. The method of claim 14, wherein the one or more process conditions include a thickness of the sacrificial layer, a temperature at which the annealing is performed, and duration of the removing process, and wherein at least one of a thickness of the sacrificial layer, a temperature at which the annealing is performed, or a duration of the removing process is varied between an initial and a subsequent step performance.

17. The method of claim 15, wherein one or more process conditions are independently selected for the initial and each of the subsequent depositing, annealing, and removing steps for the pinned layer to improve an element removal process and reduce the risk of damage to the underlying MTJ.

18. A method for providing a magnetic memory on a substrate usable in a magnetic device, the method comprising:
depositing a first ferromagnetic layer of a free layer, the first ferromagnetic layer of the free layer including a CoFeB layer not more than about fifteen Angstroms thick;
depositing a first sacrificial layer on the first ferromagnetic layer, the first sacrificial layer being not more than about four Angstroms thick and including at least one of Bi, W, I, Zn, Nb, Ag, Cd, Hf, Os, Mo, Ca, Hg, Sc, Y, Sr, Mg, Ti, Ba, K, Na, Rb, Pb, and Zr;
annealing at least the first ferromagnetic layer and the first sacrificial layer at a first temperature greater than about 25 degrees Celsius, the annealing further including performing a first rapid thermal anneal (RTA);
removing at least a portion of the first sacrificial layer; and
depositing a second sacrificial layer on the first ferromagnetic layer, the second sacrificial layer being not more than about four Angstroms thick and including at least one of Bi, W, I, Zn, Nb, Ag, Cd, Hf, Os, Mo, Ca, Hg, Sc, Y, Sr, Mg, Ti, Ba, K, Na, Rb, Pb, and Zr;
annealing at least the first ferromagnetic layer and the second sacrificial layer at a second temperature greater than 25 degrees Celsius, the annealing further including performing a second RTA;
removing at least a portion of the second sacrificial layer; and
depositing a second ferromagnetic layer of the free layer on a remaining portion of the first ferromagnetic layer, the second ferromagnetic layer including a CoFeB layer not more than about fifteen Angstroms thick such that the remaining portion of the first ferromagnetic layer and the second ferromagnetic layer together have a thickness of not more than about twenty-five Angstroms and the free layer has a perpendicular magnetic anisotropy energy greater than an out-of-plane demagnetization energy, the free layer being switchable between a plurality of stable magnetic states when a write current is passed through the free layer.

\* \* \* \* \*